(12) United States Patent
Sakata et al.

(10) Patent No.: US 6,339,344 B1
(45) Date of Patent: Jan. 15, 2002

(54) SEMICONDUCTOR INTEGRATED CIRCUIT DEVICE

(75) Inventors: Takeshi Sakata, Kodaira; Hitoshi Tanaka, Ome; Osamu Nagashima, Hamura; Masafumi Ohi, Ome; Sadayuki Morita, Higashiyamato, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/497,280

(22) Filed: Feb. 2, 2000

(30) Foreign Application Priority Data

Feb. 17, 1999 (JP) .......................................... 11-039053
Jul. 26, 1999 (JP) .......................................... 11-210270

(51) Int. Cl.[7] ................................................. H03K 19/0175
(52) U.S. Cl. ......................... 326/83; 326/115; 326/121
(58) Field of Search ............................. 326/83, 86, 115, 326/119, 121; 327/51–57, 77

(56) References Cited

U.S. PATENT DOCUMENTS

| | | | | | |
|---|---|---|---|---|---|
| 5,442,277 | A | * | 8/1995 | Mori et al. | 327/530 |
| 5,557,221 | A | * | 9/1996 | Taguchi et al. | 327/53 |
| 5,751,186 | A | * | 5/1998 | Nakao | 327/65 |
| 6,121,812 | A | * | 9/2000 | Tsukikawa | 327/280 |

FOREIGN PATENT DOCUMENTS

| | | |
|---|---|---|
| JP | 3-219722 | 9/1991 |
| JP | 5-48430 | 2/1993 |
| JP | 6-104725 | 4/1994 |
| JP | 6-104726 | 4/1994 |
| JP | 7-7412 | 1/1995 |
| JP | 7-143184 | 6/1995 |
| JP | 7-240679 | 9/1995 |
| JP | 9-172363 | 6/1997 |
| JP | 10-173509 | 6/1998 |

OTHER PUBLICATIONS

NEC Technical Report, vol. 50, No. 3, 1997, Development Technology for Third–generation 64–bit DRAM.

* cited by examiner

*Primary Examiner*—Michael Tokar
*Assistant Examiner*—Don Phu Le
(74) *Attorney, Agent, or Firm*—Mattingly, Stanger & Malur, P.C.

(57) ABSTRACT

Differential amplifier circuits that receive input signals fed through external terminals are served with a first operation voltage and a second operation voltage through a first switching MOSFET and a second switching MOSFET, said first and second switching MOSFETs are turned on by a bias voltage-generating circuit when said input signal is near a central voltage of said first and second operation voltages, control voltages are formed to turn either said first switching MOSFET or said second switching MOSFET on and to turn the other one off to produce a corresponding output signal when the input signal continuously assumes said first voltage or said second voltage for a predetermined period of time, thereby to supply an input signal of a first amplitude corresponding to said first operation voltage and said second operation voltage as well as an input signal of a second amplitude corresponding to a predetermined intermediate voltage between said first operation voltage and said second operation voltage.

25 Claims, 22 Drawing Sheets

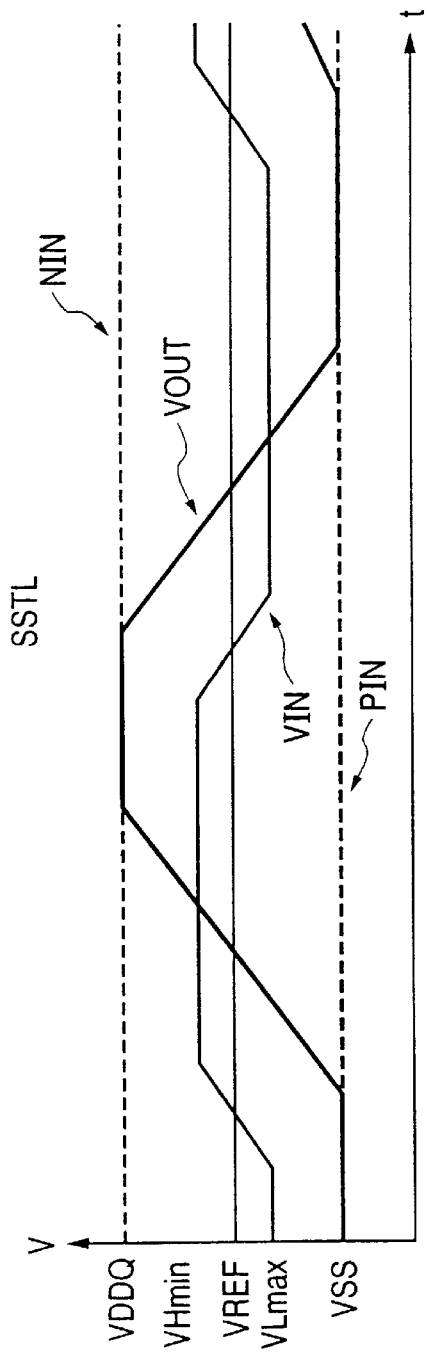
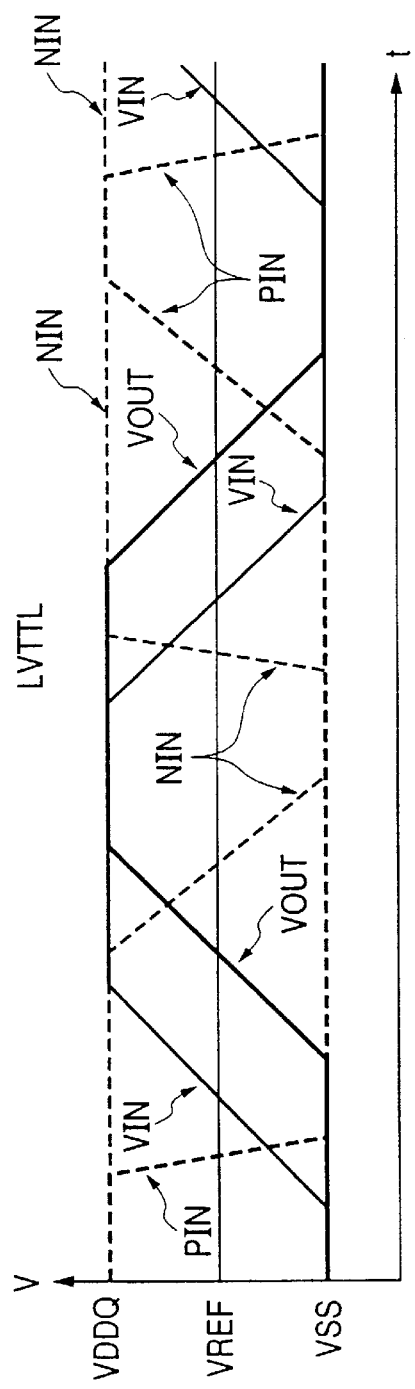

SEMICONDUCTOR INTEGRATED CIRCUIT DEVICE

BACKGROUND OF THE INVENTION

FIELD OF THE INVENTION

The present invention relates to a semiconductor integrated circuit device. More specifically, the invention relates to technology that can be effectively utilized for an input circuit in a general-purpose semiconductor integrated circuit device such as a dynamic RAM (random access memory).

Through the search after the present invention has been finished, the present inventors have been informed of the presence of the inventions disclosed in Nippon Electric Corporation, "NEC Technical Journal", Vol. 50, No. 3, 1997, pp. 23–27 (Development of a 64-Megabit DRAM of the Third Generation), Japanese Patent Laid-open No. 104726/1994 and Japanese Patent Laid-open No. 143184/1995, that appear to be related to the input circuit of the present invention that will be described later. The above literatures suggest the use of a differential amplifier in the input circuit, but are quite silent concerning the method of operating the input circuit of the present invention that will be described later.

SUMMARY OF THE INVENTION

The voltage levels of input signals input to semiconductor integrated circuit devices such as dynamic RAMs are standardized depending on the interfaces such as SSTL, LVTTL, LVCMOS, etc. For the LVTTL and LVCMOS interfaces in which the signal level has a full amplitude corresponding to the operation voltage, there is used an input buffer comprising a CMOS inverter circuit. For the SSTL employing a small amplitude with the center voltage of the operation voltage as a center, on the other hand, there is used a differential amplifier circuit.

Two kinds of the input buffers are formed so as to be applied to any one of the above-mentioned interfaces, and any one is finally determined by the metal option, so that most of the steps for producing the semiconductor devices can be used in common to enhance the productivity. In this case, however, unnecessary circuits are inevitably formed causing the degree of integration to decrease. Besides, after either interface is selected by the metal option, the products must be managed as different products.

In order to simplify the circuit and to facilitate the management of products, the present inventors have contrived an input circuit that receives input signals having relatively large amplitudes like those of LVTTL and LVMOS as well as the signals of small amplitudes that change near a neutral-point voltage like those of the above-mentioned SSTL. In developing such an input circuit, the inventors have contrived not to permit the flow of an operation current into the input circuit when the semiconductor integrated circuit device is not in operation like in the LVTTL and LVCMOS interfaces, in addition to stably forming internal signals in response to dissimilar input signals. Further, in the input circuits such as of the above-mentioned LVTTL and LVCMOS, the present inventors have attempted to realize input/output transfer characteristics that are adapted to a low threshold voltage as the devices are realized in fine sizes, and to reduce the consumption of electric power and increase the stability.

An object of the present invention is to provide a semiconductor integrated circuit device which substantially decreases the consumption of electric power while enabling an input circuit therefor to be simplified and the management and handling of the products to be facilitted.

Another object of the present invention is to provide a semiconductor integrated circuit device equipped with an input circuit adapted to finely fabricating the devices and is capable of realizing stable input/output transfer characteristics.

The above and other objects of the present invention as well as novel features of the present invention will become obvious from the description of the specification and the accompanying drawings.

Briefly described below is a representative example of the invention disclosed in the present application. That is, an input circuit in which differential amplifier circuits that receive an input signal fed through external terminals are served with a first operation voltage and a second operation voltage through a first switching MOSFET and a second switching MOSFET, said first and second switching MOSFETs are turned on by a bias voltage-generating circuit when said input signal is near a central voltage between said first operation voltage and said second operation voltage, control voltages are formed to turn either said first switching MOSFET or said second switching MOSFET on and to turn the other one off to produce a corresponding output signal when the input signal continuously assumes said first voltage or said second voltage for a predetermined period of time, thereby to supply an input signal of a first amplitude corresponding to said first operation voltage and said second operation voltage as well as an input signal of a second amplitude corresponding to a predetermined intermediate voltage between said first operation voltage and said second operation voltage.

Briefly described below is another representative example of the invention disclosed in the present application.

That is, an input circuit for receiving input signals fed through the external terminals, comprising:

a first differential amplifier circuit including differential MOSFETs of a first type of electric conduction and a first MOSFET of the first type of electric conduction provided for the common sources thereof to form an operation current;

a second differential amplifier circuit including differential MOSFETs of a second type of electric conduction and a second MOSFET of the second type of electric conduction provided for the common sources thereof to form an operation current; and an inverter circuit for forming an output signal;

wherein an input signal is fed from an external terminal to the input terminals of one side of said first and second differential amplifier circuits, a reference voltage which is nearly an intermediate potential between the high level and the low level of the input signal is fed to the input terminals on the other side of said first and second differential amplifier circuits, and an output signal is synthesized from those of said first and second differential amplifier circuits which are in phase and is fed to the input terminal of said inverter circuit.

BRIEF DESCRIPTION OF THE DRAWINGS

FIGS. 5A and 5B are diagrams of waveforms illustrating the operation of the input circuit according to the present invention;

DETAILED DESCRIPTION OF THE INVENTION

Figure 1:
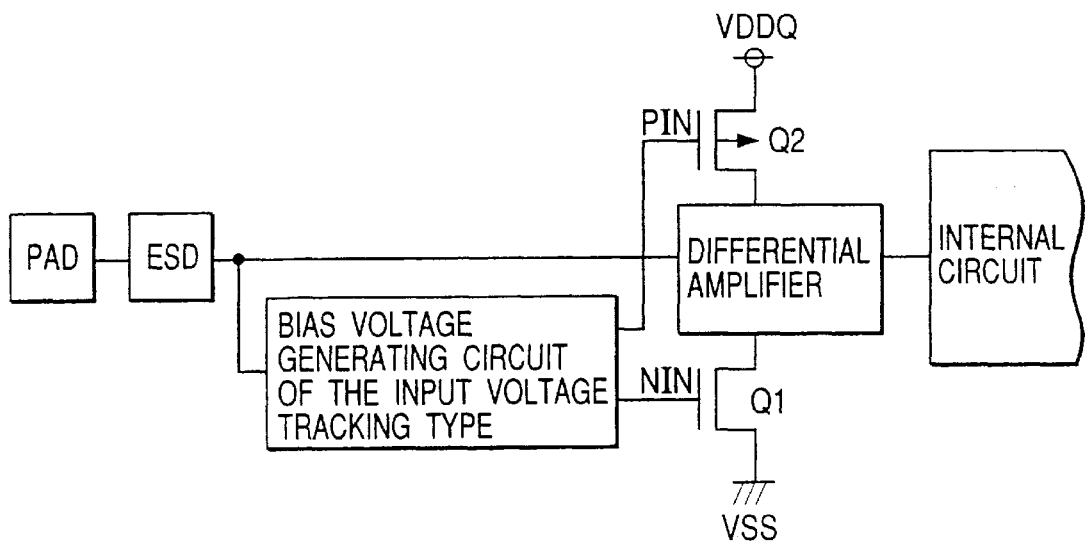
FIG. 1 is a diagram illustrating the constitution of an input circuit provided in a semiconductor integrated circuit device according to an embodiment of the present invention.

FIG. 1 is a diagram illustrating the constitution of an input circuit provided in a semiconductor integrated circuit device according to an embodiment of the present invention. The input circuit according to this embodiment amplifies an input signal through a differential amplifier circuit to form an internal signal. In order to decrease the operation current, the differential amplifier circuit is provided with an N-channel MOSFET Q1 and a P-channel MOSFET Q2 for feeding ground potential VSS of the circuit as a first operation voltage and a power source voltage VDDQ as a second operation voltage. A bias voltage-generating circuit that receives the input signals forms control voltages that are fed to nodes NIN and PIN to which the gates of the MOSFETs Q1 and Q2 are connected.

An input signal fed to a pad connected to an external terminal is sent to the input of the bias voltage-generating circuit and to the input of the differential amplifier circuit through an electrostatic protection circuit ESD. The bias voltage-generating circuit forms control voltages NIN and PIN that correspond to the voltage levels of the input signal, and turn either the N-channel MOSFET Q1 or Q2 on and the other one off to produce a corresponding internal signal when the input signal is the power source voltage VDDQ or the ground potential VSS of the circuit. When the input signal has a small amplitude changing near the central voltage which is one-half the power source voltage VDDQ, the bias voltage-generating circuit forms control voltages that are fed to the nodes NIN and PIN to turn both the N-channel MOSFETs Q1 and Q2 on.

As described above, the bias voltage-generating circuit of this embodiment detects whether the input signal has a large amplitude level such as the power source voltage VDDQ or the ground potential VSS of the circuit like that of the LVTTL or the LVCMOS or has a small amplitude changing near the central voltage which is one-half the power source voltage VDDQ like that of the SSTL. The bias voltage-generating circuit forms control voltages (bias voltages) fed to the nodes NIN and PIN, and is the one of the so-called input voltage tracking type.

The input circuit is distinguished for each of the interfaces on account of the following reasons. The input buffer is formed based on such a rule that the input signal larger than VHmin (minimum voltage for judging the input signal to be of a high level VH) is necessarily judged to be of a high level, and the input signal smaller than VLmax (maximum voltage for judging the input signal to be of a low level VL) is necessarily judged to be of a low level. The magnitudes of VHmin and VLmax have been specified for each of the interfaces. The potential difference is the smallest in the case of the SSTL among the SSTL, LVTTL and LVCMOS.

When a CMOS inverter circuit is used for the SSTL, the theoretical threshold value must lie between the VHmin and the VLmax of the SSTL. However, the theoretical threshold value of the CMOS inverter circuit is subject to vary due to dispersion in the process and with the current technology, it is difficult to confine the theoretical threshold value between the VHmin and the VLmax of the SSTL. This technical problem becomes more difficult to solve as the process is divided more finely. Therefore, the input signal is judged by the differential amplifier circuit. When the differential amplifier circuit is employed for the LVTTL and LVCMOS, on the other hand, there arouses a problem concerning a through current that flows at all times. That is, when a CMOS circuit such as a conventional CMOS inverter circuit is used, an advantage is lost, i.e., it becomes no longer possible to inhibit the flow of operation current when the input voltage is fixed to VDDQ or VSS such as during the idle standby.

Figure 3:
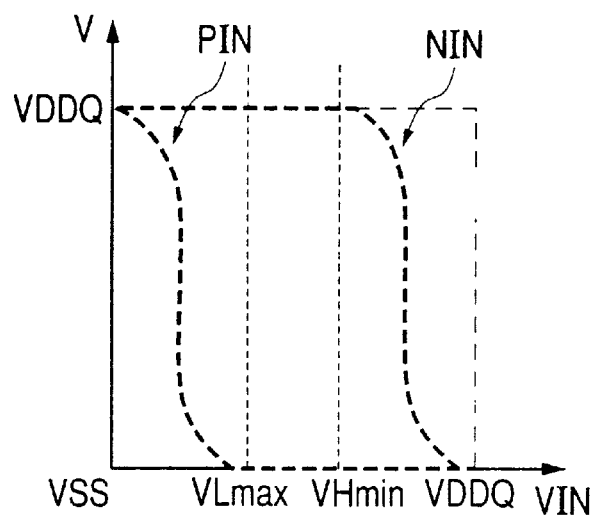
FIG. 3 is a diagram of input/output voltage characteristics of a bias voltage-generating circuit of FIG. 2.

The input circuit of this embodiment that can be used in common for all interfaces has a feature in that the newly contrived bias voltage-generating circuit of the input voltage tracking type makes it possible to control the through current of the above differential amplifier circuit as well as the through current thereof. The principle of operation will be roughly described below though the details will be described later. Use of the bias voltage-generating circuit of the input voltage tracking type of the present invention makes it possible to obtain static characteristics for the nodes PIN and NIN as shown in FIG. 3.

When a signal of a small amplitude (maximum value VHmin, minimum value VLmax) is input, therefore, the node PIN assumes the low level and the node NIN assumes the high level, whereby the P-channel MOSFET Q2 and the N-channel MOSFET Q1 are both turned on, and the differential amplifier circuit is operated to amplify the input signal.

When the input signal is fixed to VDDQ, the nodes PIN and NIN are both fixed to VSS, whereby the N-channel MOSFET Q1 is turned off due to the node NIN of the low level, and the differential amplifier circuit discontinues the amplification operation. Even when the input signal is fixed to VSS, the nodes PIN and NIN are both fixed to VDDQ, whereby the P-channel MOSFET Q2 is turned off due to the node PIN of the high level, and the differential amplifier circuit discontinues the amplification operation.

The bias voltage-generating circuit of the input voltage tracking type of the present invention is capable of cutting off its own current together with the differential amplifier circuit as will be described later, and is capable of completely cutting off the current consumed by the whole input buffer. These characteristics are the same as the characteristics of the input circuit corresponding to the LVTTL or the LVCMOS using the conventional CMOS inverter circuit. As described above, the input buffer of the present invention uses the input circuit of the differential amplifier circuit type yet exhibiting characteristics equal to those of the input circuit such as the CMOS inverter circuit, and can be used in common for all interfaces such as the SSTL, LVTTL and LVCMOS.

Figure 2:
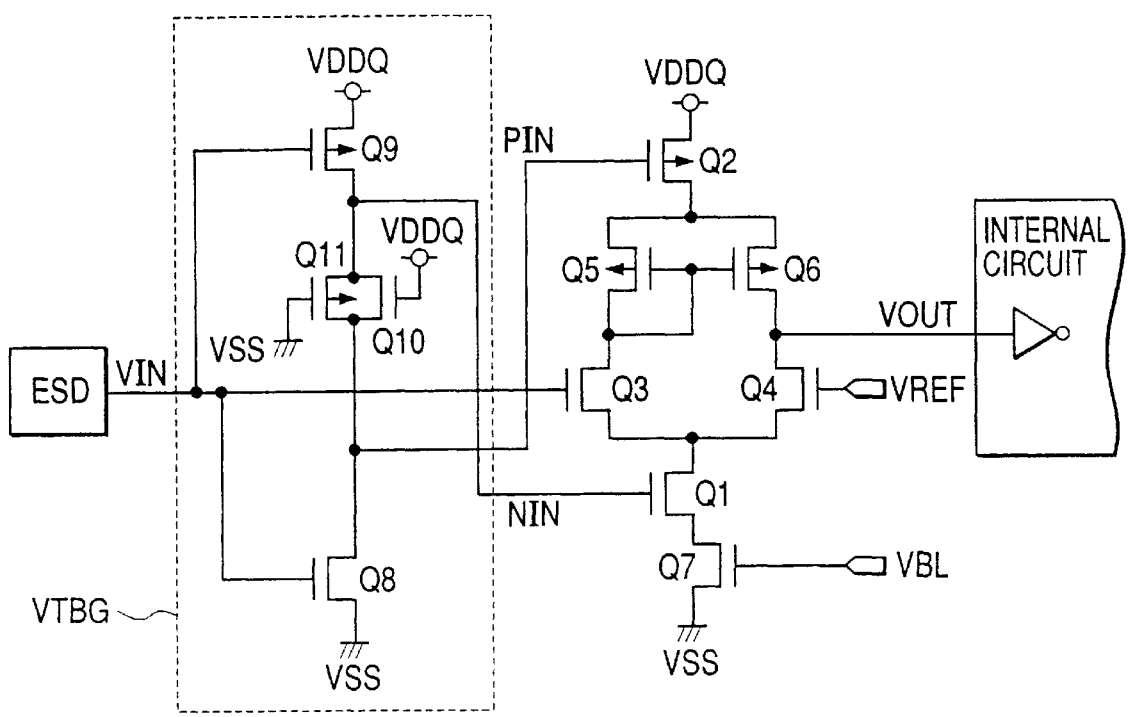
FIG. 2 is a diagram of the input circuit according to the embodiment of the present invention.

FIG. 2 is a diagram illustrating an input circuit according to an embodiment of the present invention. The differential amplifier circuit is constituted by connecting P-channel load MOSFETs Q5 and Q6 in the form of a current mirror to the drain side of N-channel differential MOSFETs Q3 and Q4 that are served with an input voltage VIN and a reference voltage VREF through the gates thereof, and by providing an N-channel current-source MOSFET Q7 on the common source side through the N-channel switching MOSFET Q1. The current-source MOSFET Q7 is served with the ground potential VSS of the circuit through the source thereof and is served with a constant voltage VBL through the gate thereof. The P-channel switching MOSFET Q2 is provided between the power source voltage VDDQ and the common source of the P-channel MOSFETs Q5 and Q6 in the form of a current mirror.

The bias voltage-generating circuit VTBG of the input voltage tracking type is constituted by an N-channel MOSFET Q8 and a P-channel MOSFET Q9 that are served with the input signal VIN through the gates thereof, and are served with the ground potential VSS of the circuit and the power source voltage VDDQ through the sources thereof, and an N-channel MOSFET Q10 and a P-channel MOSFET Q11 connected in parallel between the drains of the MOSFETs Q8 and Q9 to work as high-resistance elements. The N-channel MOSFET Q10 is constantly served with the power source voltage VDDQ through the gate thereof and the P-channel MOSFET Q11 is constantly served with the ground potential VSS of the circuit through the gate thereof, so as to work as resistance elements. The N-channel MOSFET Q8 produces, through the drain thereof, a bias voltage to the node PIN so as to be sent to the gate of the P-channel MOSFET Q2, and the N-channel MOSFET Q9 produces, through the drain thereof, a bias voltage to the node NIN so as to be sent to the gate of the N-channel MOSFET Q1.

It can be regarded that the bias voltage generating circuit VTBG of the input voltage tracking type comprises a combination of an N-channel MOSFET Q8 and a P-channel MOSFET Q9 that receive an input voltage VIN for driving, and an inverter circuit formed of a high-resistance load provided for the drains thereof. Therefore, the inverter circuit comprising the N-channel MOSFET Q8 and the high-resistance load circuit exhibits input/output transfer characteristics as shown in FIG. 5. That is, when the input voltage VIN exceeds the threshold voltage of the N-channel MOSFET Q8, the MOSFET Q8 is turned on, and the control voltage sent from the drain thereof to the node PIN sharply drops from VDDQ down to a low level such as the ground potential VSS of the circuit.

The inverter circuit comprising the P-channel MOSFET Q9 and the high-resistance load circuit exhibits input/output transfer characteristics as shown in FIG. 3. That is, a difference between the input voltages VIN and VDDQ is applied across the source and gate of the P-channel MOSFET Q9. When the differential voltage becomes smaller than the threshold voltage of the P-channel MOSFET Q9, therefore, the MOSFET Q9 is turned off, and the control voltage sent from the drain thereof to the node NIN drops from VDDQ down to a low level such as the ground potential VSS of the circuit. By using a high-resistance element as a pass gate in the bias voltage-generating circuit VTBG of the input voltage tracking type, as described above, the static characteristics are obtained for the nodes PIN and NIN as shown in FIG. 3.

When a signal of a small amplitude such as of the SSTL is input, therefore, the switching MOSFETs Q2 and Q1 are turned on by the node PIN of the low level and the node NIN of the high level, whereby the differential amplifier circuit receives an operation current at all times, and effects the amplification operation while receiving a differential voltage between the input signal VIN and a reference voltage (reference voltage) VREF corresponding to the logic threshold voltage of the SSTL.

When the input signal VIN has a full amplitude (VDDQ-VSS) and is fixed to, for example, VDDQ, the nodes PIN and NIN both assume VSS, the P-channel MOSFET Q2 is maintained turned on, the N-channel MOSFET Q1 is turned off, and the differential amplifier circuit discontinues the operation. In a transient state of until the N-channel MOSFET Q1 is turned off due to the input signal VIN of the high level, the differential MOSFET Q3 is turned on to maintain the MOSFETs Q5 and Q6 turned on. Therefore, the P-channel MOSFET Q2 that is turned on produces an output VOUT of the high level such as the power source voltage VDDQ.

When the N-channel MOSFET Q10 and the P-channel MOSFET Q11 are connected in parallel as the high-resistance load elements, the node PIN can be varied to the high level such as the power source voltage VDDQ and the node NIN can be varied to the low level such as the ground potential VSS of the circuit without losing the level that is caused by the threshold voltages of the MOSFETs. When the input signal VIN has the full amplitude, therefore, the switching MOSFET Q1 or Q2 fixed to VDDQ or VSS can be reliably turned off, making it possible to decrease the consumption of current by the differential amplifier circuit.

When the N-channel switching MOSFET Q1 is turned off due to the node NIN of the low level, the differential amplifier circuit discontinues the amplification operation but the output signal VOUT is maintained at the high level. In this case, the P-channel MOSFET Q9 in the bias voltage-generating circuit VTBG of the input voltage tracking type is turned off, and no through current flows therein. Theoretically, therefore, no current is consumed by the whole input circuit comprising the differential amplifier circuit and the bias voltage-generating circuit.

Figure 4:
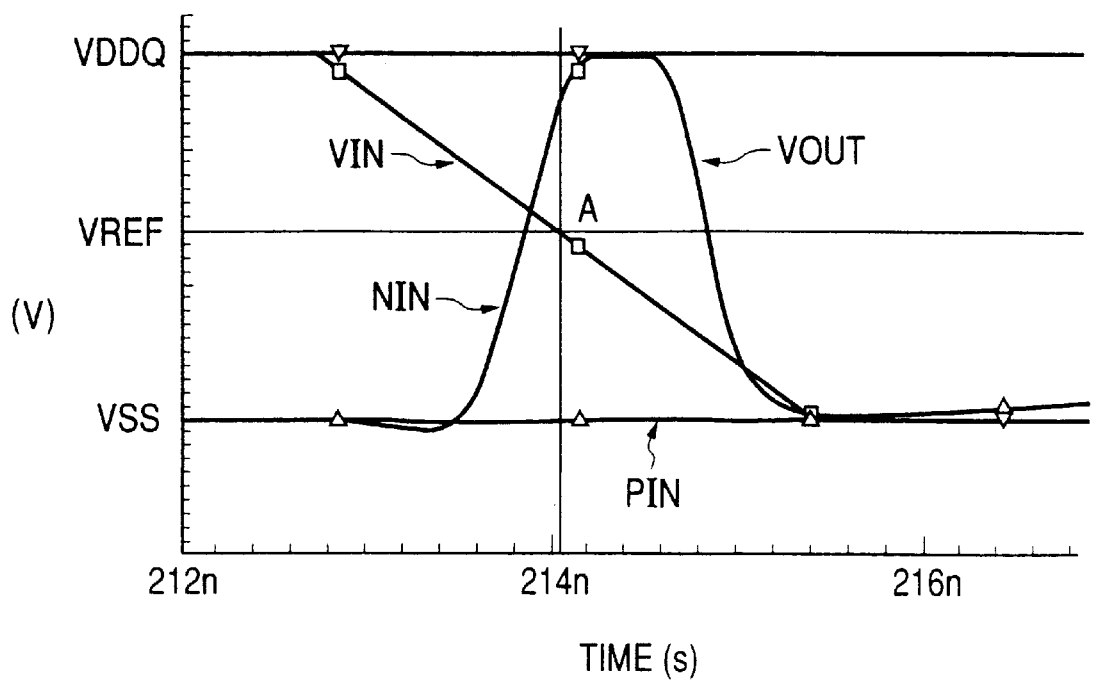
FIG. 4 is a diagram of a waveform illustrating the simulated results of the input circuit of FIG. 2.

This means that a decreased current flows into the input circuit of the address, command and data systems when the semiconductor integrated circuit device such as the dynamic RAM is in an idling state and is standing by. When the input signal breaks down to VSS from the state of being fixed to VDDQ, only the node NIN that had been pulled down to VSS is quickly raised to VDDQ, the switching MOSFET Q1 is turned on, and the differential amplifier circuit readily resumes the amplification operation as shown in a waveform diagram of FIG. 4 which is the result of simulation.

That is, as the input signal VIN changes from the state of being fixed to VDDQ into the low level in response to the input signal such as of the LVTTL, the node NIN rises to the high level to operate the differential amplifier circuit before the level thereof reaches the central voltage VREF. As the input signal VIN becomes smaller than the reference voltage VREF, therefore, the output signal VOUT changes from the high level into the low level in response thereto, making it possible to form an output signal OUT equivalent to that of the LVTTL interface. When the input signal rises from VSS to VDDQ, too, the differential amplifier circuit can be changed from the inoperative state over to the amplifying operation based on the same principle.

The circuit of the invention stably operates for the input of a small amplitude such as of the SSTL, and further exhibits the characteristics of the CMOS input buffer decreasing the consumption of current to zero when the input signal of the full amplitude is fixed to the VDDQ and VSS, lending itself well for being used in common for all interfaces.

FIG. 2 has illustrated the differential amplifier circuit of the N-channel MOSFETs such as differential MOSFETs Q3 and Q4. However, the differential amplifier circuit may be constituted by using the P-channel MOSFETs. In the differential amplifier circuit comprising NMOSs, in general, a maximum value and a minimum value in the output amplitude greatly vary depending upon the power source voltage. The minimum value of the amplitude shifts toward the side of the intermediate potential of the operation voltage of the inverter circuit in the next stage and, hence, a large through current flows into the inverter circuit of the next stage. In the differential amplifier circuit comprising the P-channel MOSFETs, on the other hand, the minimum value remains nearly constant at VSS suppressing the through current that flows into the inverter circuit of the next stage.

FIGS. 5A and 5B are diagrams of waveforms illustrating the operation of the input circuit according to the present invention, wherein FIG. 5A illustrates the case where the input signal VIN has a small amplitude such as of the SSTL, and FIG. 5B illustrates the case of LVTTL (LVCMOS) where the input signal VIN has a large amplitude such as of the power source voltage VDDQ and the ground potential VSS.

In FIG. 5A, when the input signal varies over a range between VHmin and VLmax, the node PIN is fixed to the low level, the node NIN is fixed to the high level, and the MOSFETs Q2 and Q1 are maintained turned on. Therefore, an operation current formed by the constant-current MOSFET Q7 flows into the differential amplifier circuit to amplify the input signal VIN to form an output signal VOUT of a large amplitude corresponding to the power source voltage VDDQ and the ground potential VSS of the circuit. Concerning the output signal VOUT of the differential amplifier circuit, strictly speaking, remaining voltages necessary for operating the differential amplifier circuit generate on the side of the power source voltage VDDQ and on the side of the ground potential VSS of the circuit. This voltage, therefore, is supplied to the CMOS inverter circuit and is amplified so as to be converted into the CMOS level.

In FIG. 5A, when the input signal VIN varies in a range between VHmin and VLmax, the node PIN is fixed to the low level and the node NIN is fixed to the high level due to the bias voltage-generating circuit. Therefore, the P-channel switching MOSFET Q2 and the N-channel switching MOSFET Q1 in the differential amplifier circuit are both turned on. Accordingly, the differential amplifier circuit effects the amplification operation at all times due to the constant current formed by the current source MOSFET Q7. Therefore, when the input signal VIN is larger than the reference voltage VREF, the output signal OUT is set to the high level and when the input signal VIN is lower than the reference voltage VREF, the output signal OUT is set to the low level.

In FIG. 5B, when the input signal VIN has a large amplitude such as of VDDQ and VSS, e.g., when the input signal VIN has the low level such as the ground potential VSS of the circuit, the node PIN is rendered to assume the high level and the output signal VOUT assumes the low level. As the input signal VIN changes into the high level, the N-channel MOSFET Q8 in the bias voltage-generating circuit is turned on, whereby the node PIN sharply changes into the low level to turn on the P-channel MOSFET Q2 in the differential amplifier circuit to start the amplification operation. As the level of the input signal VIN exceeds the reference voltage VREF, therefore, the output signal VOUT changes from the low level to the high level.

As the input signal VIN remains stable at the high level, the P-channel MOSFET Q9 in the bias voltage-generating circuit is turned off, and the node NIN is pulled to the low level side through the MOSFETs Q10 and Q11 that are high-resistance elements. While the N-channel MOSFET Q1 in the differential amplifier circuit is turned off and the input signal VIN remains stable at the high level for more than a predetermined period of time, therefore, the operation current flowing into the differential amplifier circuit is cut to establish the low power consumption mode. In the bias voltage-generating circuit, too, the P-channel MOSFET Q9 is turned off to cut the direct current that flows steadily.

When the input signal VIN changes from the power source voltage VDDQ to the low level such as the ground potential VSS of the circuit, the node NIN assumes the high level due to the P-channel MOSFET Q9 that is turned on, whereby the N-channel MOSFET Q1 in the differential amplifier circuit is turned on. Therefore, when the level of the input signal VIN becomes smaller than the reference voltage VREF, the output signal VOUT changes from the high level to the low level. Similarly, while the input signal VIN remains stable at the low level for more than a predetermined period of time, the operation current flowing into the differential amplifier circuit is cut to establish the low power consumption mode. In the bias voltage-generating circuit, too, the N-channel MOSFET Q8 is turned off to cut the direct current that flows steadily.

Figure 6:
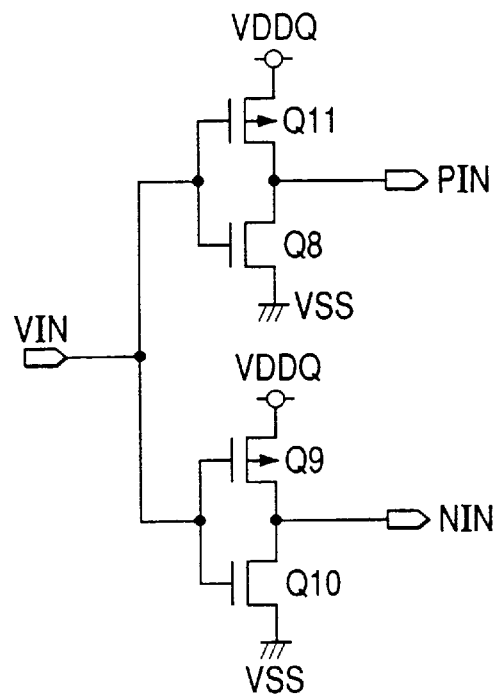
FIG. 6 is a diagram of a bias voltage-generating circuit of the input voltage tracking type according to another embodiment of the present invention.

FIG. 6 is a diagram illustrating the bias voltage-generating circuit of the input voltage tracking type according to another embodiment. In the circuit of this embodiment, the nodes PIN and NIN are independently provided with the bias voltage-generating circuit of the input voltage tracking type to facilitate the control operation. That is, the MOSFETs Q8 and Q9 are drive MOSFETs, and the MOSFETs Q11 and Q10 are high-resistance load MOSFETs. The high-resistance elements are single units instead of the pass gates of a parallel connection shown in FIG. 2. Therefore, a high resistance is obtained without increasing the channel length; i.e., a comparable resistance is obtained using a MOS of a decreased channel length.

Figure 7:
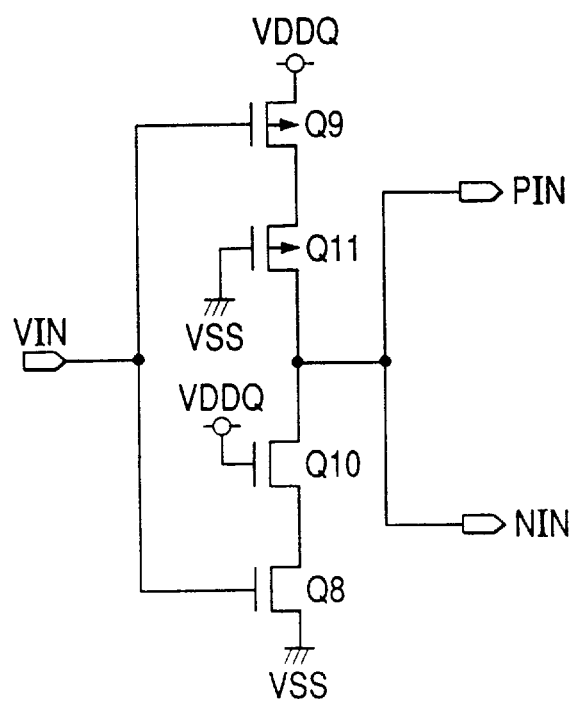
FIG. 7 is a diagram of a bias voltage-generating circuit of the input voltage tracking type according to a further embodiment of the present invention.
Figure 9:
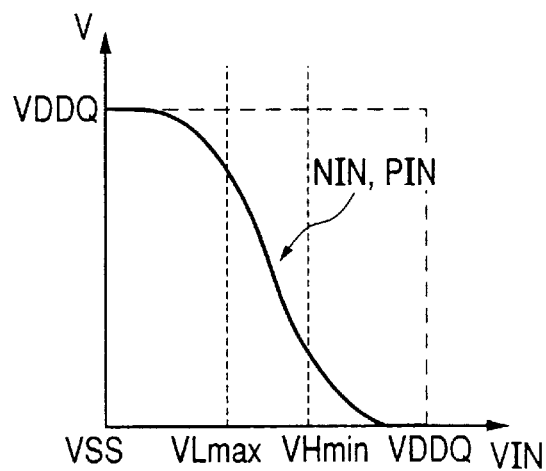
FIG. 9 is a diagram of input/output voltage characteristics of the bias voltage-generating circuit of the input voltage tracking type shown in FIG. 7.

FIG. 7 is a diagram illustrating the bias voltage-generating circuit of the input voltage tracking type according to a further embodiment. In the circuit of this embodiment, the nodes PIN and NIN are connected in common. In order to turn the differential amplifier circuit on in response to an input signal of a small amplitude, the N-channel MOSFET Q10 and the P-channel MOSFET Q11 are incorporated as high-resistance elements in the CMOS inverter circuit comprising the N-channel MOSFET Q8 and the P-channel MOSFET Q9 to form the input/output transfer characteristics as shown in FIG. 9 in order to maintain the nodes PIN and NIN at an intermediate potential. Since the nodes PIN and NIN assume the intermediate potential as described above, the MOSFETs Q1 and Q2 for switching the differential amplifier circuit are not fully turned on but tend to operate near the saturated region. It is therefore expected that CMRR can be increased.

Figure 8:
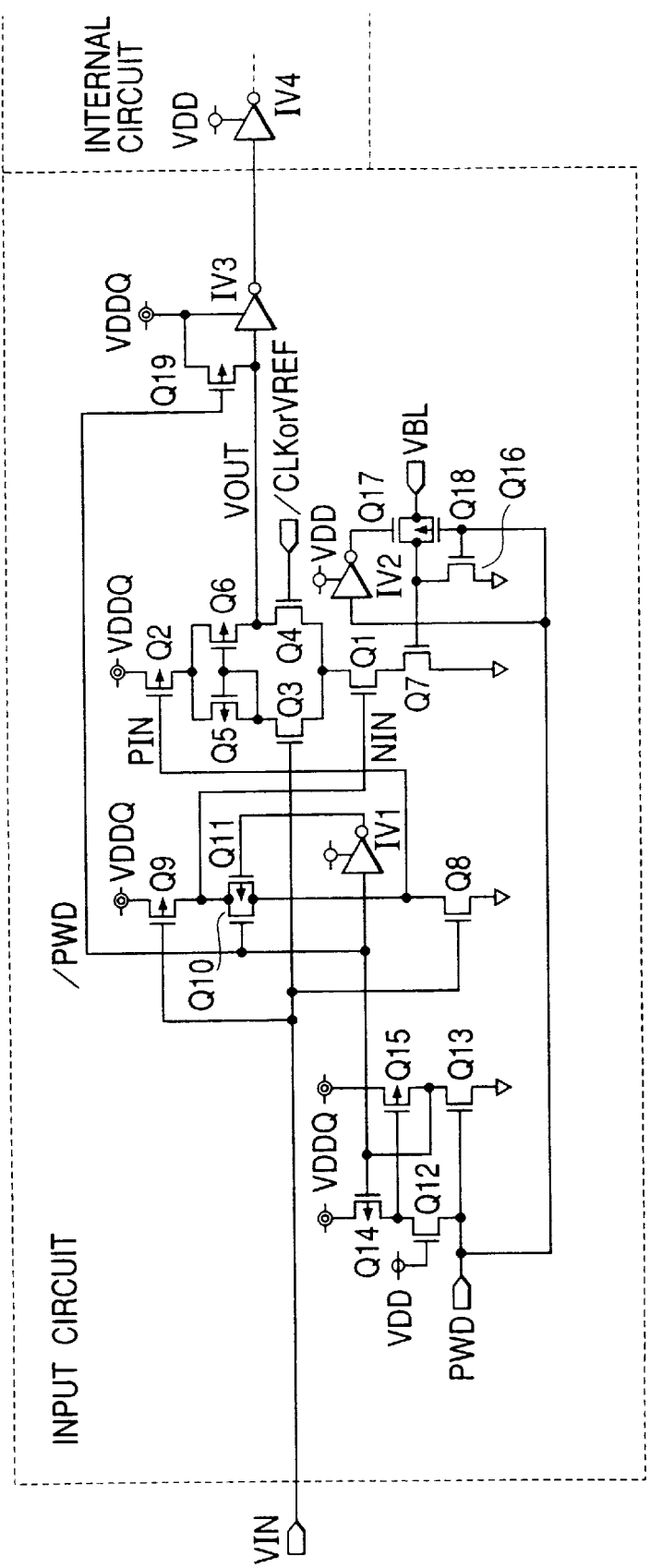
FIG. 8 is a diagram of an input circuit according to another embodiment of the present invention.

FIG. 8 is a diagram illustrating the input circuit according to a further embodiment of the present invention. In this embodiment, the input circuit is provided with a power down function that works when an input of a small amplitude is received. In the dynamic RAM, in order to realize an interface for the external unit such as the microprocessor, the input/output circuit is operated by an external power source voltage VDDQ corresponding thereto. On the other hand, the internal circuit is operated by an internal voltage VDD formed by lowering the external power source voltage VDDQ in order to maintain breakdown voltage of the elements finely fabricated for high degree of integration.

When the internal circuit is operated by the lowered operation voltage VDD, the input circuit is designed to possess a function for converting the voltage level of the external input signal into the level of the internal signal. The internal circuit that is constituted by a MOS circuit has a high input impedance. In this case, therefore, the signal level to be sent to the internal circuit needs not be lowered in the input circuit. In the internal circuit, however, the input MOSFET must have a fairly large breakdown voltage since it receives a high voltage corresponding to the external power source voltage VDDQ.

The internal circuit that is not shown forms a power-down signal PWD. Therefore, the power-down signal PWD has a signal level like VDD-VSS corresponding to the internal voltage VDD. Accordingly, the power-down signal PWD is converted through the next level conversion circuit into a signal level corresponding to VDDQ. The power-down signal PWD is fed to the source of the N-channel MOSFET Q12 that is served with the internal power source voltage VDD at all times through the gate thereof, and to the gate of the N-channel MOSFET Q13 that is served with the ground potential of the circuit through the source thereof. P-channel MOSFETs Q14 and Q15 of which the gate and drain are connected in a crossing manner are provided between the power source voltage VDDQ and the drains of the MOSFETs Q12 and Q13.

The level conversion circuit forms a power-down control signal /PWD which is inverted relative to the signal PWD and of which the high level is VDDQ, and feeds it to the gate of the N-channel MOSFET Q10 constituting the high resistance. The power-down control signal /PWD is further inverted through an inverter circuit IV1 operated by the external power source voltage VDDQ, and is fed to the gate of the P-channel MOSFET Q11 that constitutes the high resistance. As the power-down signal PWD formed by the internal circuit assumes the high level, therefore, the output signal /PWD of the level conversion circuit assumes the low level, whereby the N-channel MOSFET Q10 is turned off. The output signal /PWD of the level conversion circuit varies in response to the low level, the output signal of the inverter circuit IV1 assumes the high level depending on the external power source voltage VDDQ, and the P-channel MOSFET Q11 is turned off.

When the semiconductor integrated circuit device is placed in the powder-down mode, therefore, the direct current no longer flows into the bias voltage-generating circuit even in a state where the input signal of a small amplitude such as of the SSTL is fed to the input circuit. Then, the power-down control signal /PWD turns the P-channel MOSFET Q19 on, so that the input signal to the inverter circuit IV3 that forms the output signal is fixed to the external power source voltage VDDQ. Therefore, the input signal sent to the internal circuit assumes the low level irrespective of the input signal VIN fed through the external terminal.

In addition to the control operation of the above-mentioned output circuit and the bias voltage-generating circuit by the power-down control signal /PWD formed through the above-mentioned level conversion circuit, the differential amplifier circuit no longer supplies the operation current. That is, the MOSFET Q7 which is the current source receives, through the gate thereof, a constant voltage VBL through the CMOS switch comprising the P-channel MOSFET Q18 and the N-channel MOSFET Q17. The gate of the P-channel MOSFET Q18 constituting the CMOS switch is served with the power-down signal PWD formed by the internal circuit, and the gate of the N-channel MOSFET Q17 is served with the output of the inverter circuit IV2 that forms an inverted signal thereof, so as to be turned off in the power-down mode. Due to the N-channel MOSFET Q16 served with the power-down signal PWD through the gate thereof, the MOSFET Q7 is served with the ground potential of the circuit through the gate thereof and is turned off.

The above-mentioned input circuit can be applied to an address input circuit that controls the operation in response to the operation mode, to the input circuit that receives control signals and to the input circuit that receives the data. In the synchronous DRAM that will be described later, for example, the above-mentioned input circuit can be utilized except for the clock enable signals CKE that must be monitored concerning the state of input signals at all times. As the input circuit for receiving the clock enable signals CKE, there can be used the circuit shown in FIG. 2.

Figure 10:
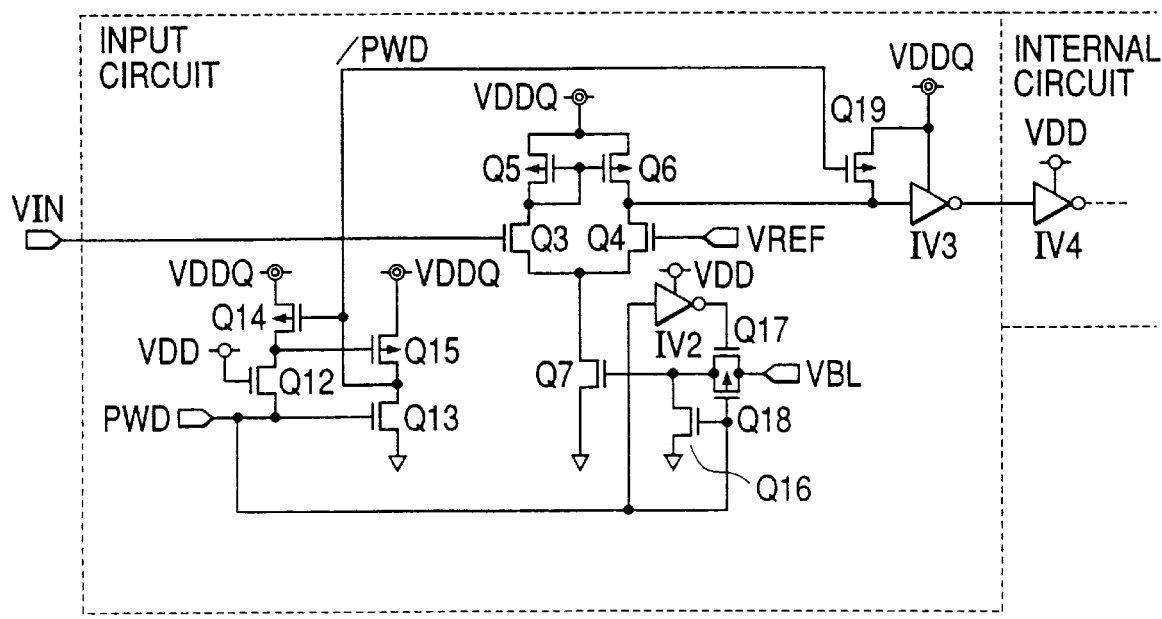
FIG. 10 is a diagram of the input circuit according to a further embodiment of the present invention.

FIG. 10 is a diagram illustrating the input circuit according to a still further embodiment of the present invention. This embodiment is suited for the input circuit which imposes limitation on the operation mode itself. For example, the data input circuit of the synchronous DRAM becomes effective when it is placed in the write mode. Therefore, this input circuit includes neither the bias voltage-generating circuit nor the switching MOSFETs Q1, Q2 controlled by the output thereof. The operation of the input circuit itself is controlled by the level conversion circuit and the circuit that controls the operation of the current source MOSFET Q7. The power-down signal PWD in this case is generated in the modes other than the write mode to control the operation current. Therefore, there substantially occurs no problem even when the bias voltage-generating circuit and the switching MOSFETs controlled thereby are omitted.

Figure 11:
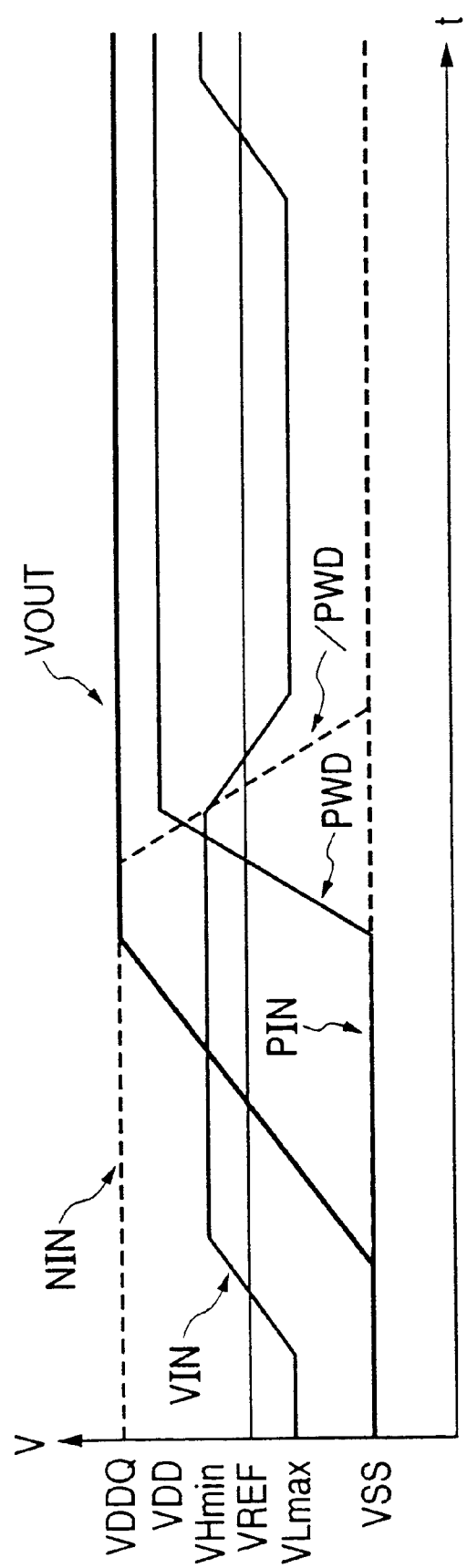
FIG. 11 is a diagram of waveforms for illustrating the operation of the input circuit of FIG. 8.

FIG. 11 is a diagram of waveforms illustrating the operation of the input circuit shown in FIG. 8. Illustrated here is the case where the input circuit is operated by a signal of a small amplitude like that of the SSTL. When the power-down signal PWD is of the low level due to the internal circuit, an output signal VOUT is formed in response to the input signal VIN.

As the power-down signal PWD changes into the one of the high level corresponding to the internal voltage VDD due to the internal circuit, the power-down control signal /PWD of which the level is converted changes into the one of the low level to cease the operation of the bias voltage-generating circuit and to cease the operation of the differential amplifier circuit, whereby the output signal VOUT is fixed to the high level such as the power source voltage VDDQ irrespective of a change in the input signal VIN.

In the synchronous DRAM, the clock enable signal CKE is rendered to assume the low level. When it is judged that the signal CKE is of the low level for more than a predetermined period of time in the internal circuit, the power-down signal PWD is rendered to assume the high level. The consumption of current can be decreased in response to the external control signal. Further, while "CKE=low level" is being maintained after the input of a self refresh command, the self-refreshing operation is continued. During this period, the input circuit is inactivated to decrease the consumption of current.

Figure 12:
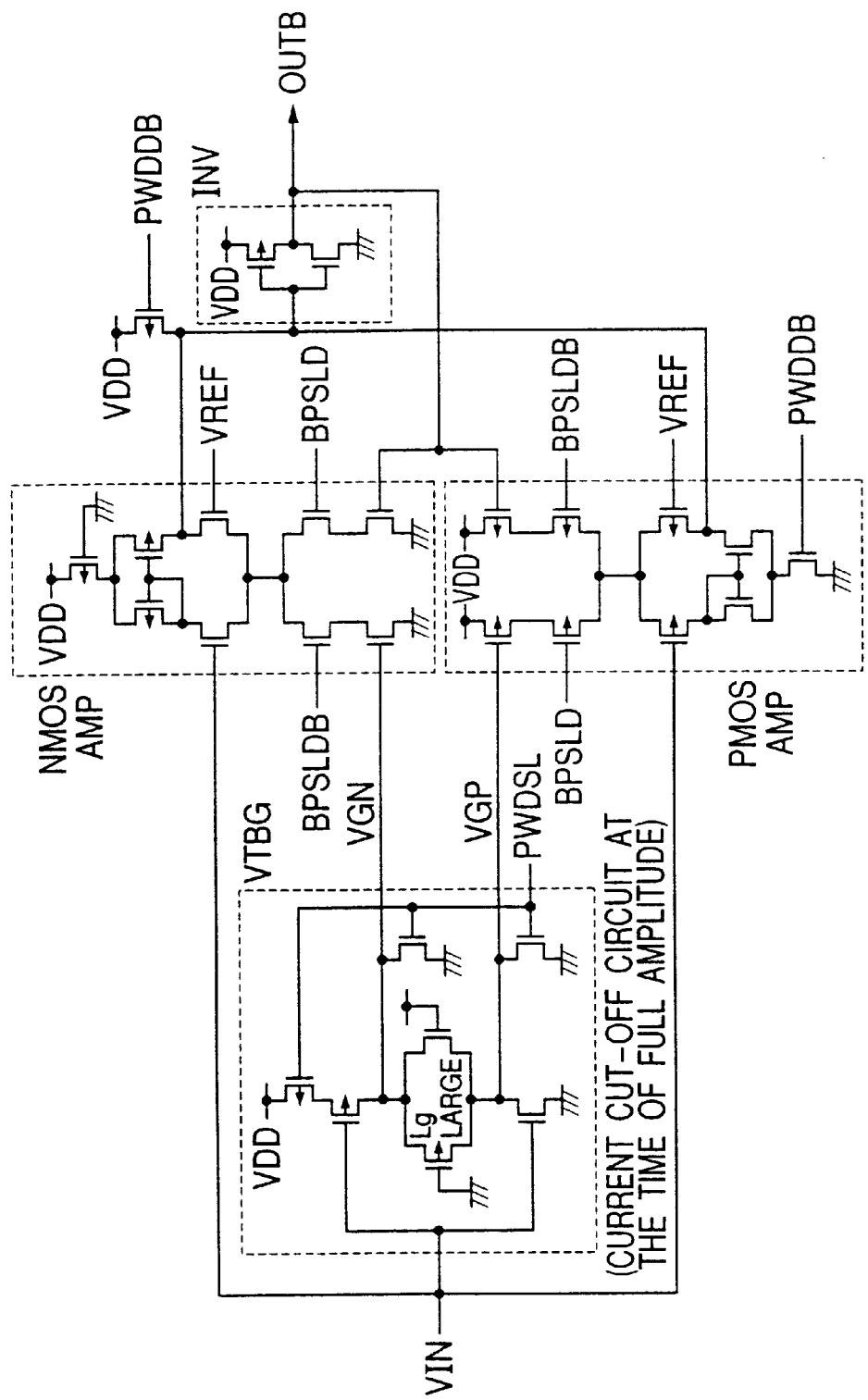
FIG. 12 is a diagram of the input circuit according to a yet further embodiment of the present invention.

FIG. 12 is a diagram illustrating the input circuit according to a yet further embodiment of the present invention. This embodiment deals with a complementary constitution based on the combination of a differential amplifier circuit of the NMOS input (hereinafter referred to as differential amplifier) and a differential amplifier of the PMOS input, the two differential amplifiers producing outputs of a positive phase.

The differential amplifier NMOS-AMP is constituted by a load circuit that includes an N-channel MOSFET of the differential form and a P-channel MOSFET of the form of a current mirror provided for the drain thereof, and a MOSFET circuit provided for the common source of the above differential MOSFETs to form an operation current. In this embodiment, a P-channel dummy MOSFET is provided between the load circuit and the power source voltage VDD which is one operation voltage, and the ground potential of the circuit is fed to the gate thereof at all times. Though there is no particular limitation, a MOSFET circuit for forming an operation current for the SSTL and LVTTL, is provided between the common source of the N-channel differential MOSFET and the ground potential of the circuit which is another operation voltage.

The MOSFET circuits for the SSTL and LVTTL are constituted by MOSFETs that are controlled for their switching operation by selection signals BPSLDB and BPSLD formed by the bonding option, and MOSFETs connected in series with the above MOSFETs, respectively, and are applied with predetermined voltages through the gates thereof to form operation currents. The selection signals BPSLDB and BPSLD are complementary signals formed by the bonding option in response to the SSTL input or the LVTTL input, and either one assumes the low level when the other one has the high level. Thus, the operation current flows selectively for the SSTL and LVTTL.

The operation current for the SSTL is for the feedforward control operation by using a control voltage VGN formed by the bias voltage-generating circuit VTBG of the input voltage tracking type like in the above-mentioned embodiment of FIG. 2, and the operation voltage for the LVTTL is for the feedback control operation by using an output signal of the inverter circuit INV provided on the output side as will be described below. The bias voltage-generating circuit VTBG of the input voltage tracking type is for cutting the current of the differential amplifier as described earlier, and can be called full-amplitude current cut-off circuit. For easy comprehension of operation, hereinafter, the circuit VTBG is referred to as the full-amplitude current cut-off circuit.

The differential amplifier PMOS-AMP is constituted by a load circuit that includes P-channel MOSFETs of the differential form and an N-channel MOSFET of the form of a current mirror provided for the drains thereof, and a MOSFET circuit provided for the common sources of the above differential MOSFETs to form an operation current. In this embodiment, an N-channel power switching MOSFET is provided between the load circuit and the ground potential of the circuit which is another operation voltage, and a power-down signal PWDDB is fed to the gate thereof. A dummy MOSFET of the differential amplifier NMOS-AMP corresponds to the power-down MOSFET and works to balance the operation conditions between the two differential amplifiers.

MOSFET circuits for the SSTL and LVTTL in the differential amplifier PMOS-AMP are constituted by MOSFETs that are controlled for their switching operation by selection signals BPSLDB and BPSLD formed by the bonding option in the same manner as described above, and MOSFETs connected in series with the above MOSFETs and are served with predetermined voltages through the gates thereof to form an operation current. The operation current for the SSTL is for feedforward control operation by using a control voltage VGP formed by the full-amplitude current cut-off circuit VTBG, and the operation voltage for the LVTTL is for the feedback control operation by using an output signal of the inverter circuit INV provided on the output side.

The above-mentioned two differential amplifiers NMOS-AMP and PMOS-AMP produce outputs of the positive phase for the input signal VIN, and have their output terminals connected in common. The common output terminals are connected to the input terminal of the output inverter circuit INV which produces an output signal OUTB from the output terminal thereof. For effecting the feedback control in response to the LVTTL input, the output signal OUTB, on the side of the NMOS-AMP, is fed back to the gate of the MOSFET connected in series with the MOSFET that is controlled for its switching operation by the selection signal BPSLD, and is fed back, on the side of the PMOS-AMP, to the gate of the MOSFET connected in series with the MOSFET that is controlled for its switching operation by the selection signal BPSLDB.

In order to decrease the current in the power-down mode in this embodiment, there are provided a P-channel MOS- FET for cutting off the operation current of the full-amplitude current cut-off circuit VTBG and an N-channel MOSFET for fixing the output signal at that moment to the low level such as the ground potential of the circuit. A power-down signal PWDSL is fed to the gates of these MOSFETs. In the power-down mode in which the power-down signal PWDSL assumes the high level, the N-channel MOSFET is turned on and the P-channel MOSFET is turned off, thereby to cut off the operation current of the full-amplitude current cut-off circuit VTBG and to fix the output signals VGN and VGP at that moment to the low level such as the ground potential of the circuit.

On the side of the differential amplifiers, too, the power-down signal PWDDB is fed to the gate of the N-channel power-down MOSFET of the PMOS-AMP, and a P-channel pull-up MOSFET controlled for its switching operation by the power-down signal PWDDB is provided between the output terminals of the two differential amplifiers and the power source voltage VDD. In the power-down mode in which the power-down signal PWDDB assumes the low level, therefore, the operation current of the differential amplifier PMOS-AMP is cut off, and the output terminals of the two differential amplifiers NMOS-AMP and PMOS-AMP are pulled up to the power source voltage VDD. With the output terminals of the differential amplifiers being pulled up to the power source voltage VDD, the output signal of the inverter circuit INV is fixed to the low level. Due to the output signal of the inverter circuit INV, the MOSFET for forming the operation current provided for the common sources of the differential MOSFETs is turned off to cut off the operation current in the differential amplifier NMOS-AMP.

As described above, a complementary constitution is realized based on the combination of the differential amplifier NMOS-AMP of the NMOS input and the differential amplifier PMOS-AMP of the PMOS input. The differential amplifiers NMOS-AMP and PMOS-AMP both produce outputs of the positive phase and, hence, in common. The SSTL input and the LVTTL input are changed over by using the selection signals BPSLD and BPSLDB formed by the bonding option thereby to change over the method of cutting off the current of the differential amplifiers. During the SSTL input, the feedforward control is effected by using the control signals VGN and VGP formed by the full-amplitude current cut-off circuit VTBG. During the LVTTL input, the feedback control is effected by using the output signal OUTB of the inverter circuit INV provided on the output side.

According to the above-mentioned input circuit, no floating node that affects the output occurs, the standby current in the LVTTL can be decreased and dispersion in the delay time can be decreased. Besides, the setup-holding time in the external input can be decreased, and the standby current in the LVTTL can be decreased.

Irrespective of whether the input signal VIN has the high level or the low level, a current path is maintained through the MOSFET which is served with a standard voltage or a reference voltage VREF and, hence, the output terminal does not float. During the LVTTL input, the differential amplifier NMOS-AMP of the NMOS input and the differential amplifier PMOS-AMP of the PMOS input operate alternatingly due to the feedback control. Direct current characteristics are close to those of the CMOS inverter circuit, and the through current decreases to sufficient degree.

During the SSTL input, the differential amplifier NMOS-AMP of the NMOS input and the differential amplifier PMOS-AMP of the PMOS input operate in response to an input of a small amplitude. The differential amplifier NMOS-AMP of the NMOS input and the differential amplifier PMOS-AMP of the PMOS input work to compensate each other for the components of the same phase in the input signal VIN, so that the total current varies in a small amount and that the delay time varies little. When the full-amplitude input signal VIN is input during the SSTL input, the through current is cut off in the two differential amplifiers due to the feedforward control executed by using the control signals VGN and VBP formed by the full-amplitude current cut-off circuit VTBG.

Though there is no particular limitation, the SSTL interface and the LVTTL interface can be changed over by controlling the MOSFET circuit provided for the common sources of the two differential amplifiers NMOS-AMP and PMOS-AMP by using the selection signal BPSLD and its inversion signal BPSLDB formed by the bonding option. The signal PWDDB is for controlling the power down and assumes the low level during the power down. The signal PWDSL is the one based on a logic of the bonding option and the power-down control as will be described later. In the SSTL interface, the signal PWDSL assumes the high level during the power down and in the LVTTL interface unconditionally.

Figure 13A:
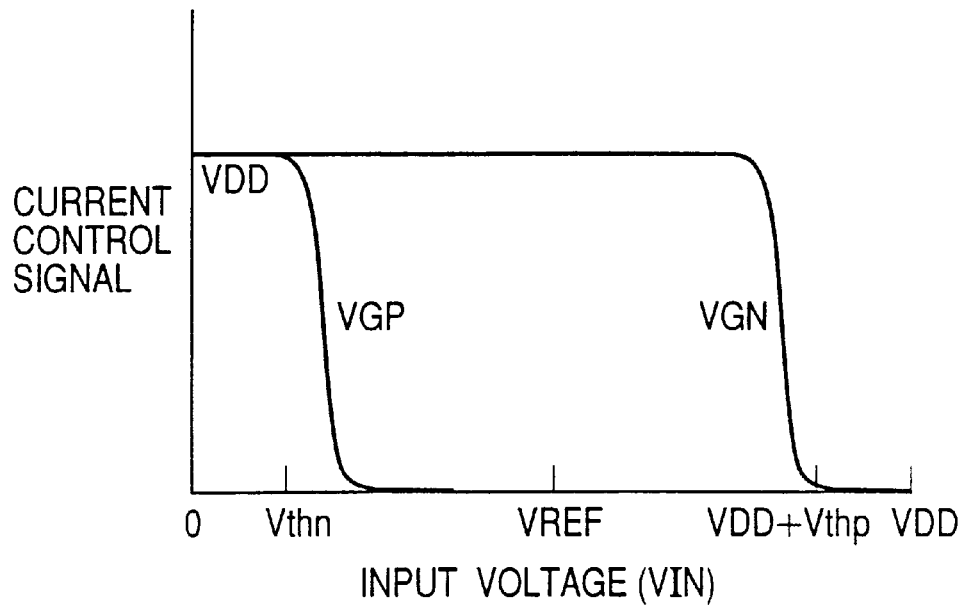
FIGS. 13A and 13B are diagrams of characteristics illustrating the operation of the input circuit of the present invention in the SSTL interface.
Figure 13B:
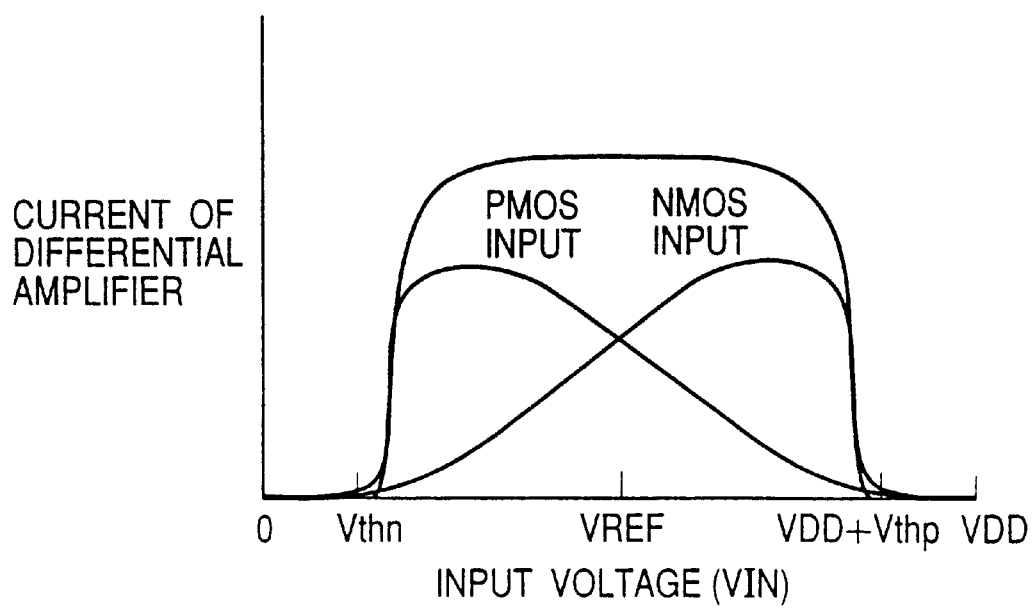

FIGS. 13A and 13B are diagrams of characteristics for explaining the operation of the input circuit of the present invention in the SSTL interface. FIG. 13A illustrates a relationship between the control signals VGN and VGP formed by the full-amplitude current cut-off circuit VTBG and the input voltage VIN, and FIG. 13B illustrates a relationship between the current of the differential amplifier and the input voltage VIN. In the SSTL interface, the signal BPSLD assumes the high level like the power source voltage VDD, the signal BPSLDB assumes the low level like the ground voltage VSS, and the operation currents for the two differential amplifiers NMOS-AMP and PMOS-AMP are controlled by the control signals VGN and VGP formed by the full-amplitude current cut-off circuit VTBG.

Referring to FIG. 13A, when the input signal VIN is near VSS, both the control signals VGN and VGP assume the power source voltage VDD, whereby the P-channel MOSFET at the common source portion of the differential amplifiers PMOS-AMP of the PMOS input is turned off to cut off the operation current of the differential amplifier PMOS-AMP of the PMOS input. In the differential amplifier NMOS-AMP of the NMOS input, at this moment, the N-channel differential MOSFET that receives the input signal VIN through the gate thereof is turned off. As a result, no current flows into the current mirror circuit of the P-channel type and the operation current of the differential amplifier NMOS-AMP of the NMOS input becomes zero. When the input signal VIN is near the power source voltage VDD, on the other hand, both the control signals VGN and VGP assume the ground potential VSS of the circuit, whereby the current of the differential amplifier of the NMOS input is cut off, the P-channel differential MOSFETs receiving the input signal VIN through the gates thereof are turned off, and the current of the differential amplifier of the PMOS input becomes zero.

In a normal operation region where the input signal VIN is near the reference voltage VREF, the control signal VGN assumes the power source voltage VDD and the control signal VGP assumes the ground potential VSS of the circuit, so that the differential amplifier NMOS-AMP of the NMOS input and the differential amplifier PMOS-AMP of the PMOS input are both activated. Referring to FIG. 13B, when the input signal VIN becomes larger than the reference voltage VREF, a current flowing through the differential amplifier NMOS-AMP of the NMOS input increases whereas a current flowing through the differential amplifier PMOS-AMP of the PMOS input decreases.

Conversely, when the input signal VIN becomes smaller than the reference voltage VREF, the current flowing through the differential amplifier NMOS-AMP of the NMOS-input decreases whereas the current flowing through the differential amplifier PMOS-AMP of the PMOS input increases. Therefore, the total current flowing through the two differential amplifiers NMOS-AMP and the PMOS-AMP is maintained nearly constant irrespective of the level of the input signal VIN. Even when the components of the same phase change in the input signal VIN and in the reference voltage VREF, therefore, the operation speed changes little and is less affected despite of a change in the ratio of characteristics of the P-channel MOSFET and the N-channel MOSFET.

Figure 14A:
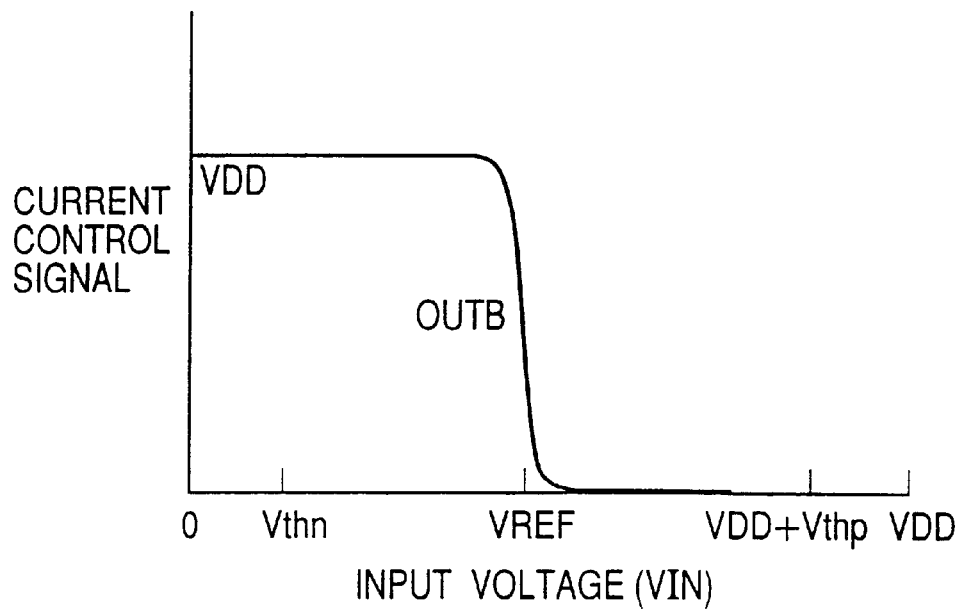
FIGS. 14A and 14B are diagrams of characteristics illustrating the operation of the input circuit of the present invention in the LVTTL interface.
Figure 14B:
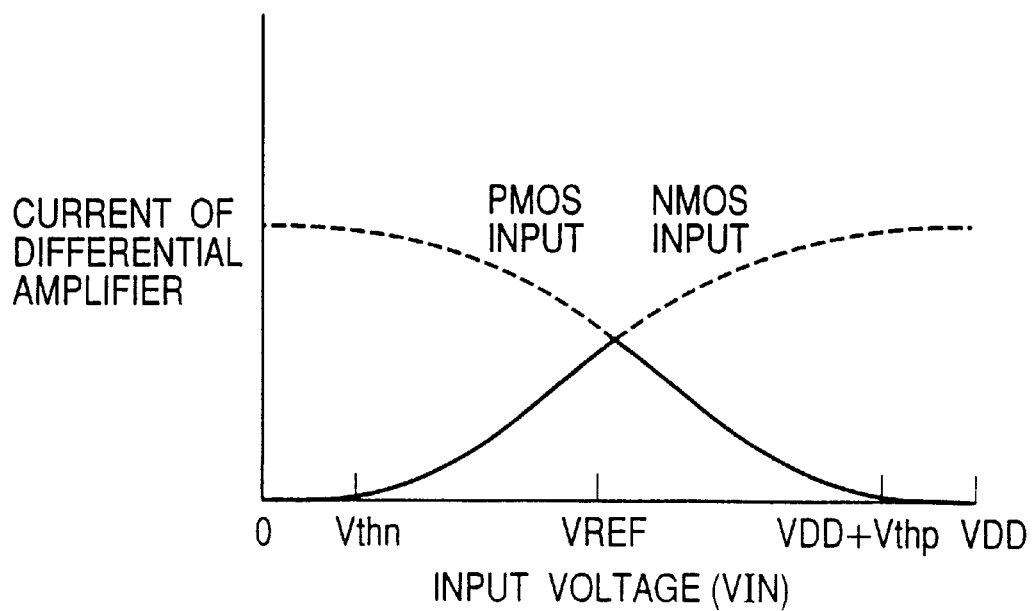

FIGS. 14A and 14B are diagrams of characteristics for illustrating the operation of the input circuit of the present invention in the LVTTL interface, wherein FIG. 14A illustrates a relationship between the output signal OUTB and the input voltage VIN, and FIG. 14B illustrates a relationship between the current of the differential amplifier and the input voltage VIN. In the LVTTL interface, the selection signal BPSLD assumes the ground potential VSS of the circuit, the selection signal BPSLDB assumes the power source voltage VDD, and the current is controlled by the output signal OUTB of the inverter circuit INV.

When the input signal VIN is smaller than the reference voltage VREF, the output signal OUTB assumes the high level like the power source voltage VDD, and the current of the differential amplifier PMOS-AMP of the PMOS input is cut off. Conversely, when the input signal VIN is higher than the reference voltage VREF, the output signal OUTB assumes the low level such as the ground potential VSS of the circuit, and the current of the differential amplifier NMOS-AMP of the NMOS input is cut off. Accordingly, the standby current can be decreased to a sufficient degree even when the P-channel MOSFET and the N-channel MOSFET have small threshold voltages as a result of finely fabricating the elements.

When the input signal VIN changes from the low level to the high level, the differential amplifier NMOS-AMP of the NMOS input is maintained activated until the output signal OUTB assumes the low level. When the input signal VIN changes from the high level to the low level, the differential amplifier PMOS-AMP of the PMOS input is maintained activated until the output signal OUTB assumes the high level. When the input signal VIN changes, therefore, a sufficiently large driving ability is obtained, and the output signal OUTB can be varied at a high speed in response thereto.

Figure 15:
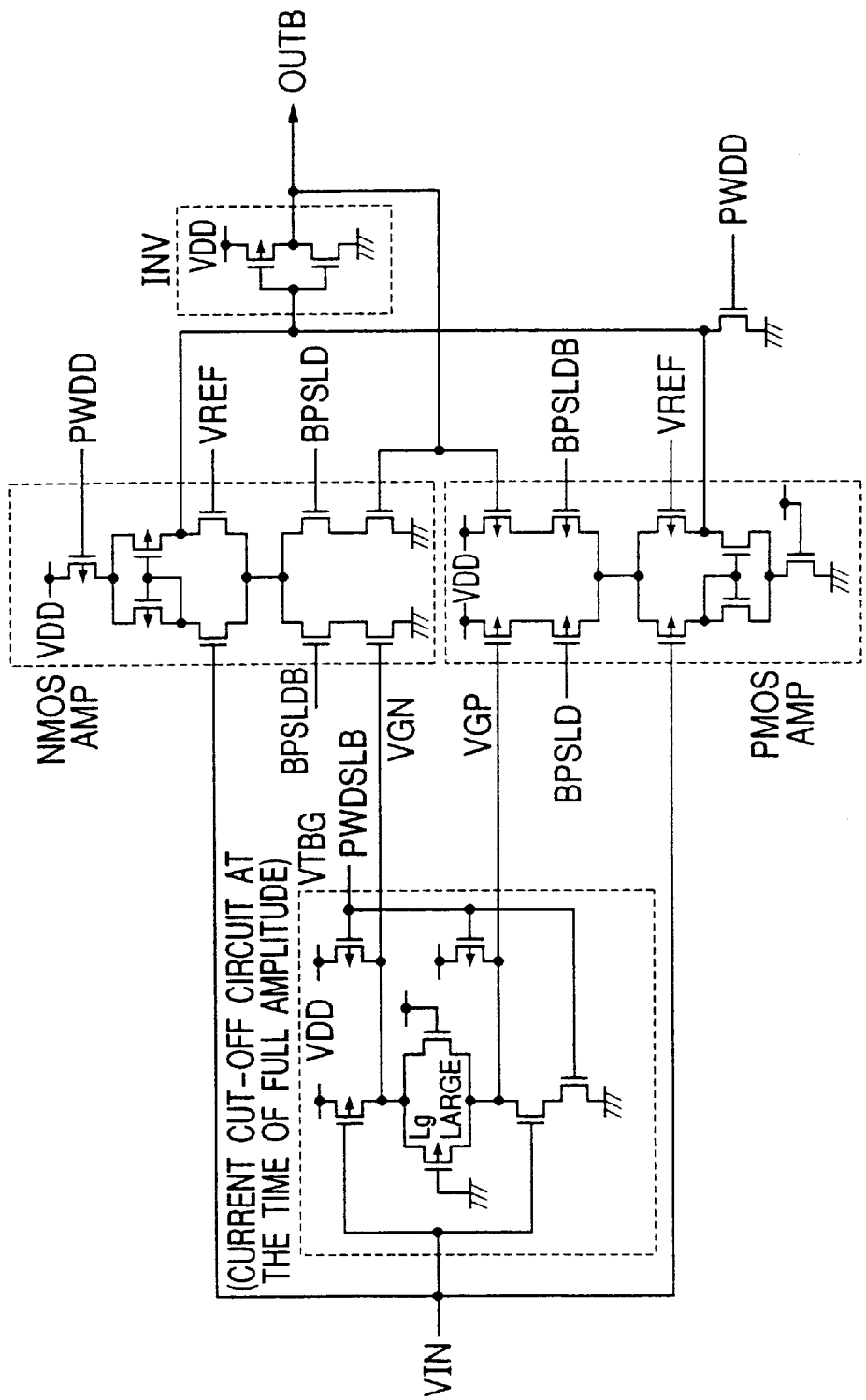
FIG. 15 is a diagram illustrating the input circuit according to a still further embodiment of the present invention.

FIG. 15 is a diagram illustrating the input circuit according to another embodiment of the present invention. In the input circuit of this embodiment, the output is reversed relative to that of FIG. 12 during the power down. The signal PWDD is for controlling the power down and assumes the high level at the time of power down. The signal PWDSLB is based on a logic of the bonding option and the power down control, and unconditionally assumes the low level during the time of power down in the SSTL interface and in the LVTTL interface.

In the full-amplitude current cut-off circuit VTBG of this embodiment contrary to the circuit of FIG. 12, the N-channel MOSFET for power down provided on the side of the grounding potential of the circuit is turned off by the signal PWDSLDB of the low level, and the control signals VGN and VGP at this moment are pulled up to the power source voltage VDD by the P-channel MOSFET that is turned on.

On the side of the differential amplifiers, the P-channel power-down MOSFET in the NMOS-AMP is served with a power-down signal PWDD through the gate thereof, and an N-channel pull-down MOSFET of which the switching operation is controlled by the above power-down signal PWDD is provided between the output terminals of the two differential amplifiers and the ground potential VSS of the circuit. In the power-down mode in which the power-down signal PWDD assumes the high level, therefore, the operation current of the differential amplifier NMOS-AMP is cut off, and the output terminals of the two differential amplifiers NMOS-AMP and PMOS-AMP are pulled down to the ground potential VSS of the circuit.

The output signal of the inverter circuit INV is fixed to the high level due to the low level that is pulled down at the output terminals of the differential amplifiers. Due to the output signal of the inverter circuit INV, the MOSFET provided for the common sources of the differential MOSFETs for forming the operation current is turned off in the differential amplifier PMOS-AMP thereby to cut off the operation current. Here, an N-channel dummy MOSFET is provided between the current mirror load circuit of the differential amplifier PMOS-AMP and the ground potential of the circuit, and is turned on at all times upon being fed with the power source voltage VDD through the gate thereof.

Figure 16:
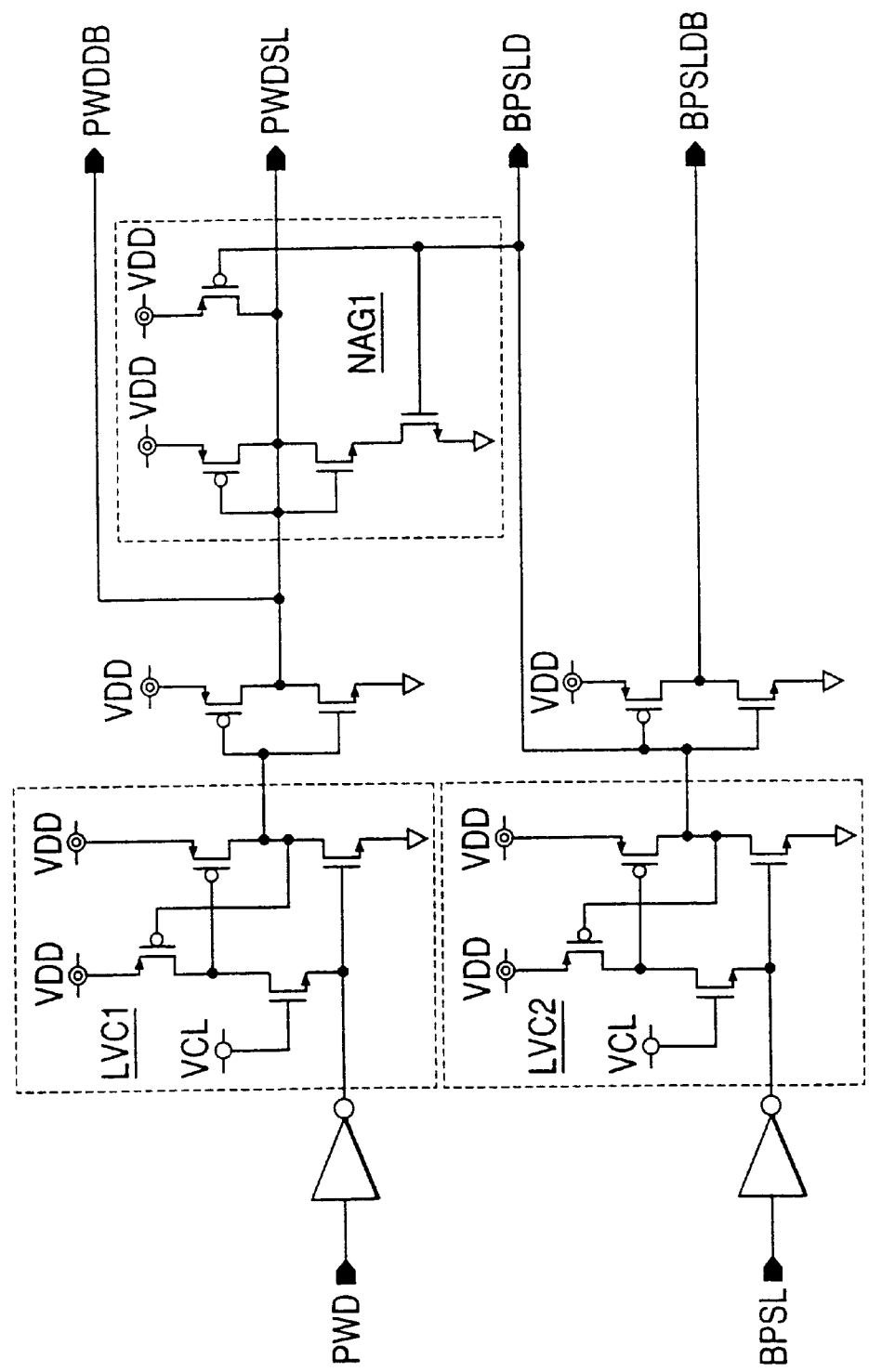
FIG. 16 is a diagram illustrating a signal-generating circuit used in the input circuit of FIG. 12 according to an embodiment.

FIG. 16 is a diagram of a signal-generating circuit according to an embodiment. The signal-generating circuit faces the input circuit shown in FIG. 12. The signal-generating circuit of this embodiment forms a power-down signal PWDSL that will be fed to the full-amplitude current cut-off circuit VTBG provided in the input circuit of FIG. 12, and forms a power-down signal PWDDB and selection signals BPSLD, BPSLDB that will be fed to the differential amplifiers NMOS-AMP and PMOS-AMP.

Though there is no particular limitation, the power-down signal PWD and the selection signal BPSL are small-amplitude signals formed by the internal circuit. The internal circuit is operated by an internal voltage VCL formed by lowering the power source voltage VDD fed through the external terminal. When the power source voltage VDD is, for example, 3.3 V or 2.5 V, the internal voltage VCL is as low as 2.0 V or 1.8 V.

The level conversion circuits LVC1 and LVC2 convert the power-down signal PWD of a small amplitude corresponding to the internal lowered voltage VCL and the selection signal BPSL into signals of relatively large amplitudes corresponding to the power source voltage VDD. The selection signal BPSLD is an output signal formed by the level conversion circuit LVC2. The selection signal BPSLDB is formed by inverting the selection signal BPSLD through the CMOS inverter circuit.

The signal obtained by converting the level of the power-down signal PWD through the level conversion circuit LVC1 is inverted through the CMOS inverter circuit, and is fed, as a power-down signal PWDDB, to the power switching MOSFET and the pull-up MOSFET in the differential amplifier. The above signal PWDDB and the selection signal BPSLD are fed to a NAND gate circuit NAG1 thereby to form a power-down signal PWDSL that is to be fed to the full-amplitude current cutoff circuit VTBG. As described above, therefore, the signal PWDSL unconditionally assumes the high level during the power down in the SSTL interface and in the LVTTL interface.

Figure 17:
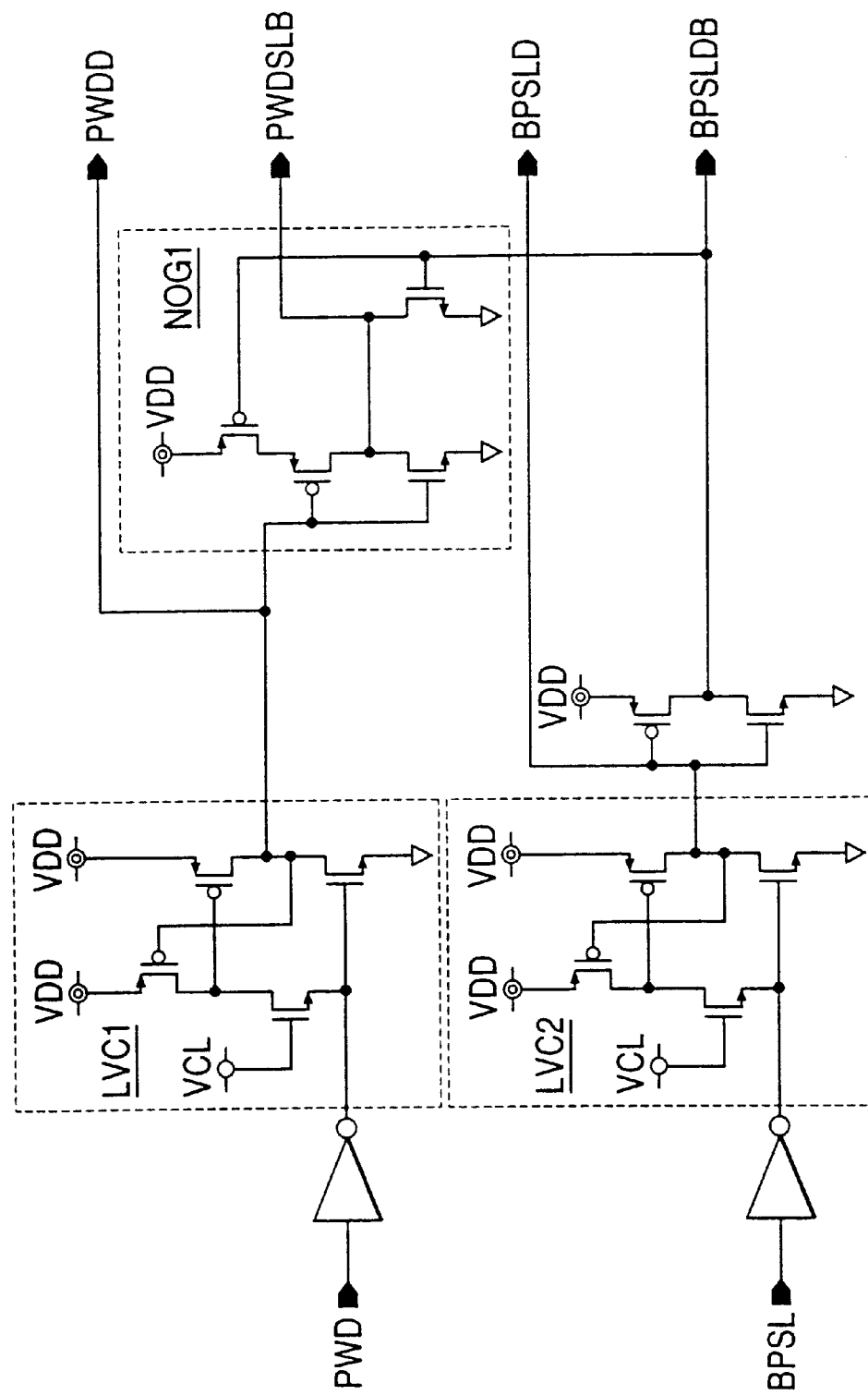
FIG. 17 is a diagram illustrating a signal-generating circuit used in the input circuit of FIG. 15 according to the embodiment.

FIG. 17 is a diagram illustrating the signal-generating circuit according to another embodiment. The signal-generating circuit faces the input circuit shown in FIG. 15. That is, the signal-generating circuit of this embodiment forms a power-down signal PWDSLB that will be fed to the full-amplitude current cut-off circuit VTBG provided in the input circuit of FIG. 15, as well as a power-down signal PWDD and selection signals BPSLD, BPSLDB that will be fed to the differential amplifiers NMOS-AMP and PMOS-AMP.

The level conversion circuits LVC1 and LVC2 convert the power-down signal PWD of a small amplitude corresponding to the internal lowered voltage VCL and the selection signal BPSL into signals of relatively large amplitudes corresponding to the power source voltage VDD in a manner as described above. The selection signal BPSLD is an output signal formed by the level conversion circuit LVC2. The selection signal BPSLDB is formed by inverting the selection signal BPSLD through the CMOS inverter circuit.

The signal obtained by converting the level of the power-down signal PWD through the level conversion circuit LVC1 is fed, as a power-down signal PWDD, to the power switching MOSFET and pull-up MOSFET in the differential amplifier. The above signal PWDD and the selection signal BPSLD are fed to a NOR gate circuit NOG1 thereby to form a power-down signal PWDSLB that will be fed to the full-amplitude current cut-off circuit VTBG. As described above, therefore, the signal PWDSL unconditionally assumes the low level during the power down in the SSTL interface and in the LVTTL interface.

For a stable operation at the time of returning from the power down in the input circuit, there are produced a signal that maintains the low level and a signal that maintains the high level during the power down. In a semiconductor integrated circuit device, the input circuits of FIGS. 12 and 15 are selectively used to cope with the above-mentioned cases while exhibiting nearly the same characteristics during the normal operation.

Figure 18:
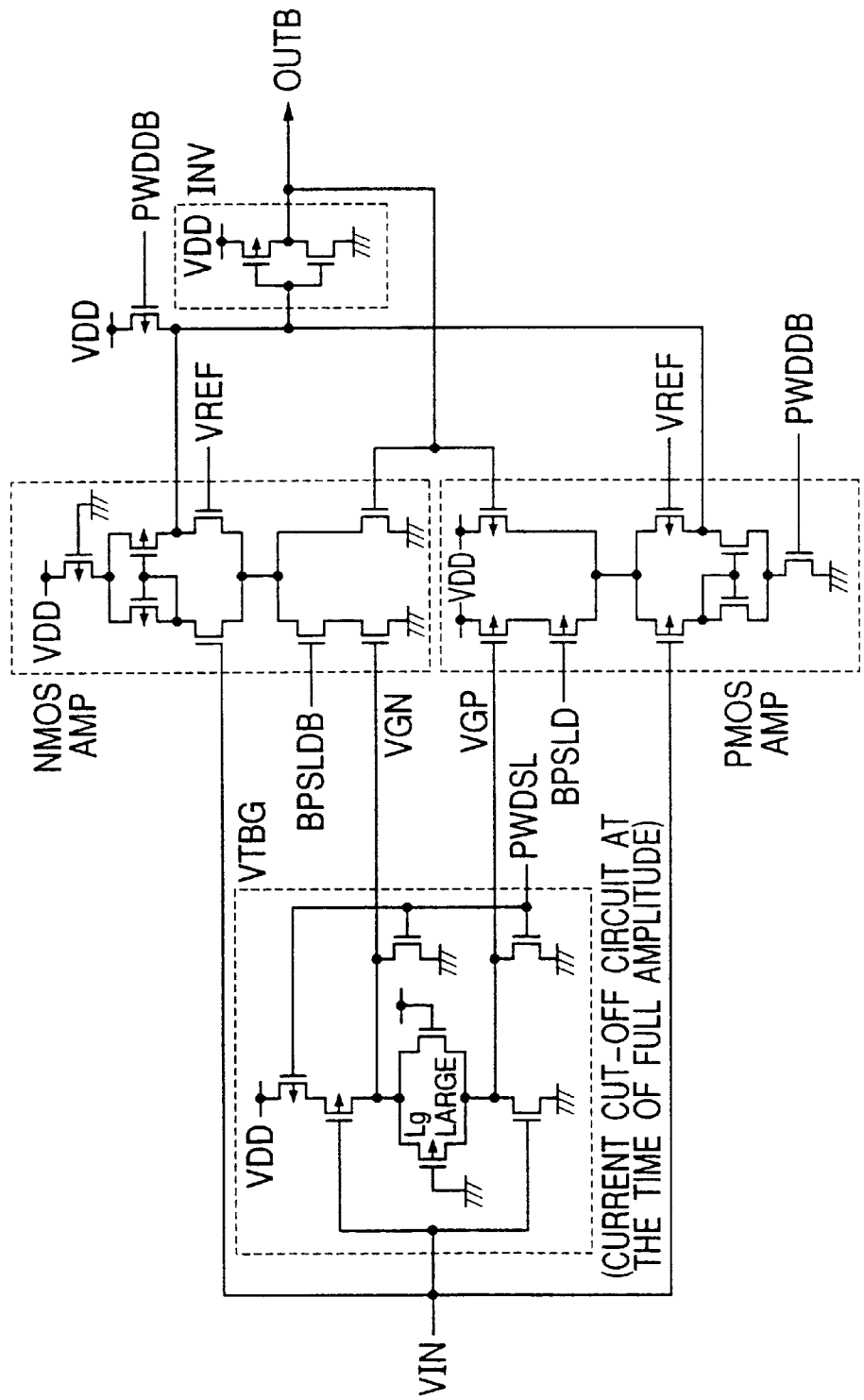
FIG. 18 is a diagram illustrating the input circuit according to a further embodiment of the present invention.

FIG. 18 is a diagram illustrating the input circuit according to a further embodiment of the present invention. This embodiment is a modification of the circuit of the embodiment of FIG. 12, and in which the switching MOSFET is omitted owing to the selection signals BPSLD and BPSLDB formed by the bonding option between the MOSFET to which the output signal OUTB is fed back and the common sources of the differential MOSFETs.

As a result of omitting the selection switching MOSFET, a current of the MOSFET to which the output signal OUTB is fed back flows to the common sources of the differential MOSFETs even in the SSTL interface. In the SSTL interface, therefore, a current formed by the MOSFET controlled by the feedback from the output signal OUTB is added to the operation of the differential amplifier, making it possible to increase the current during the operation. Therefore, the circuit can be simplified and the speed can be increased compared with the input circuit of the embodiment of FIG. 12.

Figure 19:
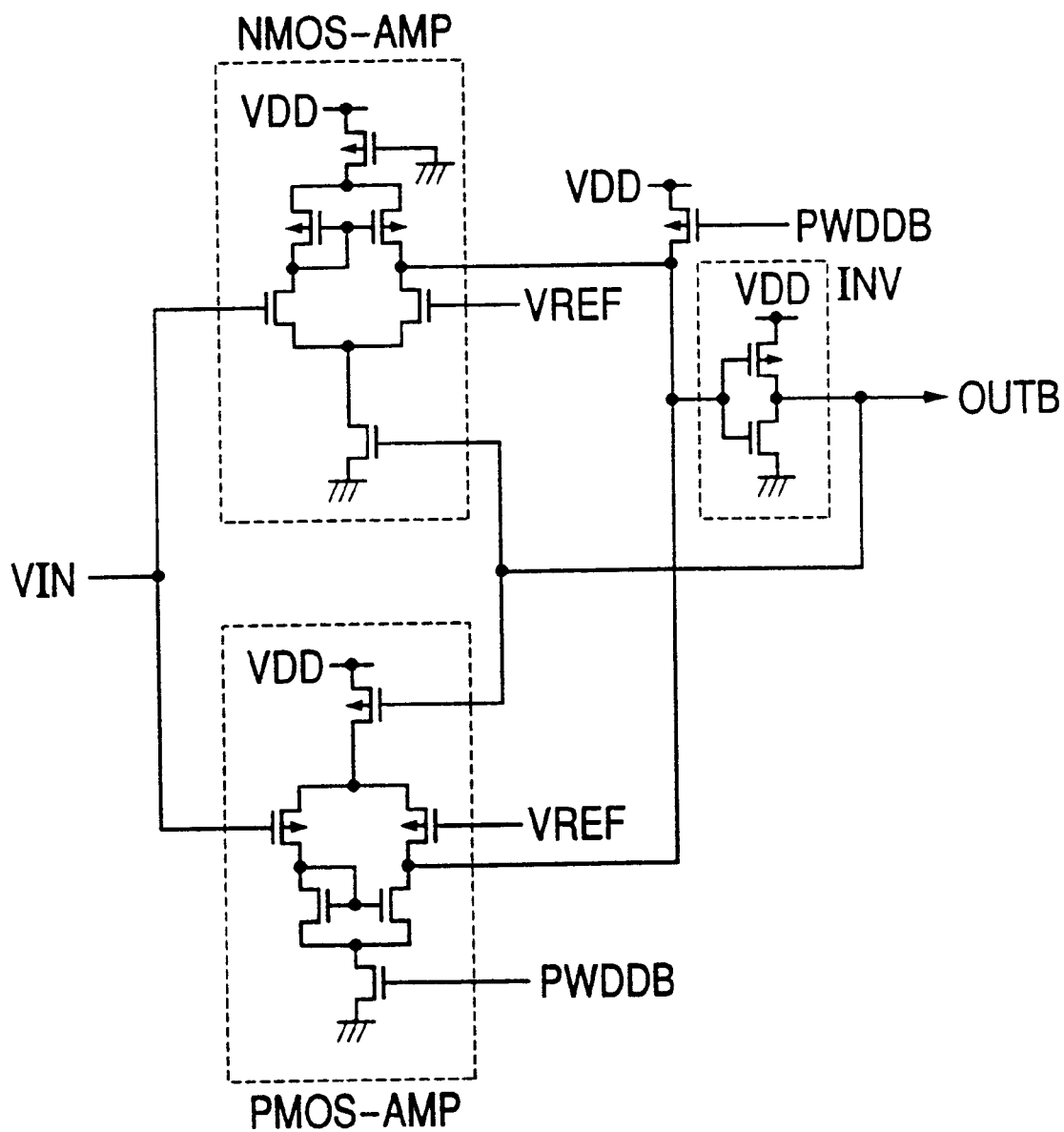
FIG. 19 is a diagram illustrating the input circuit according to a still further embodiment of the present invention.

FIG. 19 is a diagram illustrating the input circuit according to a still further embodiment of the present invention. This embodiment deals with the input circuit from which the full-amplitude current cut-off circuit VTBG has been removed. The above-mentioned features are similarly obtained in the LVTTL interface. Compared to the input circuit shown in FIG. 12, the number of the elements can be decreased, the layout area can be decreased, and the input capacity can be decreased by the input capacity of the full-amplitude current cut-off circuit VTBG as viewed from the input terminal.

The input circuit of this embodiment can be used for both the SSTL input interface and the LVTTL input interface as well as for only the LVTTL interface. When the input circuit for the LVTTL interface is constituted by the CMOS inverter circuit, the theoretical threshold voltage is determined by a ratio of conductances of the P-channel MOSFET and the N-channel MOSFET. When the CMOS inverter circuit is used as an input circuit, therefore, the theoretical threshold voltage becomes subject to be affected by the dispersion of the elements, making it difficult to maintain an input signal margin.

In the waveform diagram of FIG. 5B, the low level of the LVTTL was set to the ground potential VSS of the circuit and the high level was set to the power source voltage VDDQ. Here, however, like in the waveform diagram of the SSTL of FIG. 5A, however, the low level of the LVTTL is set to a maximum permissible value VLmax, and the high level is set to a minimum permissible value VHmin, so that VLmax=0.4 V and VHmin=2.4 V when the power source voltage VDDQ is, for example, 3.3 V.

Accompanying the trend toward finely fabricating the elements, the threshold voltage of the MOSFET is set to be as small as about 0.4 V. When the CMOS inverter circuit is constituted by the MOSFETs having such a low threshold voltage and is used as an input circuit for the LVTTL, the N-channel MOSFET is not completely turned off despite the input signal VIN is rendered to assume the low level, and a through current flows via the P-channel MOSFET and N-channel MOSFET. In order to prevent the generation of the through current when the input signal VIN has the high level or the low level, the threshold voltage of the P-channel MOSFET must be set to be not smaller than (2.4–3.3)=–0.9 V. In order to set the theoretical threshold voltage to be about 1.4 V, the threshold voltage of the N-channel MOSFET must be set to be a large value to correspond to the P-channel MOSFET.

Even in the semiconductor integrated circuit device using finely fabricated elements, the MOSFETs must have a large threshold voltage at least in the portion of the input circuit. This requires the formation of two kinds of MOSFETs having a low threshold voltage and a high threshold voltage, resulting in an increase in the process for the production. Besides, when the MOSFETs having a large threshold voltage are used for the input circuit, the speed decreases for transferring the input signals fed through the external terminal in response there to.

When the circuit shown in FIG. 19 is used as an input circuit for the LVTTL interface, the theoretical threshold voltage is determined by the reference voltage VREF and can be highly precisely set without affected by the dispersion in the elements. Even when the input circuit is constituted by using the MOSFETs having small threshold values as a result of finely fabricating the elements, the output signal OUTB is fed back so that the operation current of the differential amplifier PMOS-AMP that flows a large current in response to the input signal VIN of the low level is cut off by the feedback of the output signal OUTB when the input signal VIN has the low level of, for example, about 0.4 V. In the differential amplifier NMOS-AMP in this case, a small current flows into the differential MOSFETs due to the input signal VIN having the low level of about 0.4 V, making it possible to decrease the consumption of electric power.

Figure 20:
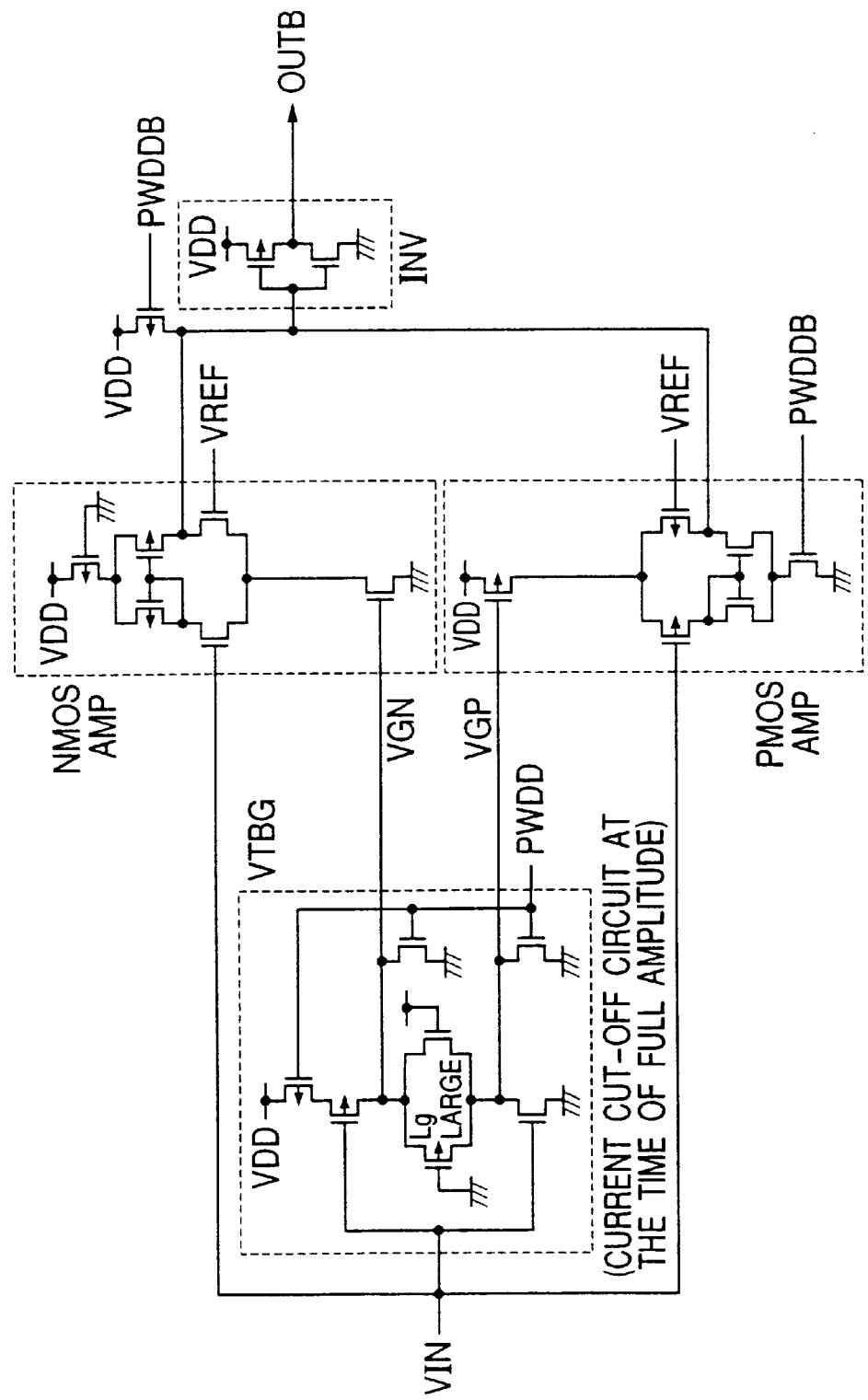
FIG. 20 is a diagram illustrating the input circuit according to a yet further embodiment of the present invention.

FIG. 20 is a diagram illustrating the input circuit according to a yet further embodiment of the present invention. In this embodiment, the circuit for feeding back the output signal OUTB is removed from the circuit of the embodiment of FIG. 12. When this input circuit is used for the SSTL interface, the features same as those described above are similarly obtained. That is, when the input circuit is used for the SSTL interface, the amount of electric power consumed by the differential amplifier can be decreased owing to the control signals VGN and VGP formed by the full-amplitude current cut-off circuit VTBG when the input voltage VIN assumes the high level or the low level. The input circuit can also be used for the LVTTL interface. As compared to the input circuit of FIG. 12, therefore, the number of the elements decreases, the layout area decreases, the load capacity at the output terminal decreases, and a high-speed operation is accomplished.

Figure 21:
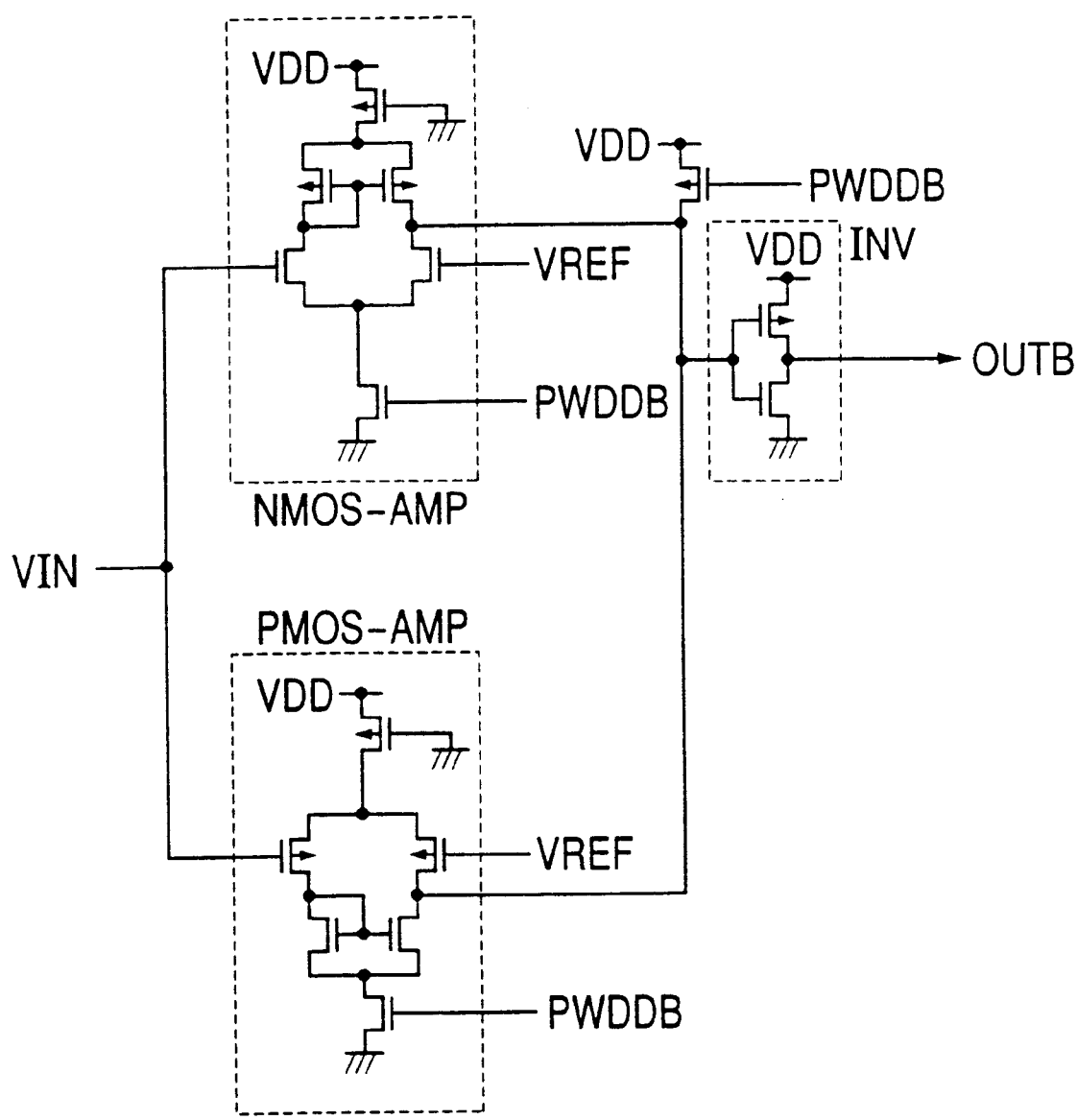
FIG. 21 is a diagram illustrating the input circuit according to a further embodiment of the present invention.

FIG. 21 is a diagram illustrating the input circuit according to a further embodiment of the present invention. In this embodiment, the full-amplitude current cut-off circuit VTBG is removed from the circuit of the embodiment of FIG. 20. That is, the input circuit has no function for decreasing the current during the full amplitude. When the current needs not be decreased during the standby, the feature is obtained in that the operation speed changes little in the SSTL interface as described above despite the function is omitted for decreasing the current during the full amplitude. The input circuit can be also operated as the input circuit for the LVTTL interface. Compared to the input circuit of the above-mentioned embodiment, therefore, the number of the elements can be decreased and the layout area can be decreased. Further, the input capacity at the input terminal is small, the load capacity at the output terminal OUTB is small, and a high-speed operation is accomplished.

Figure 22:
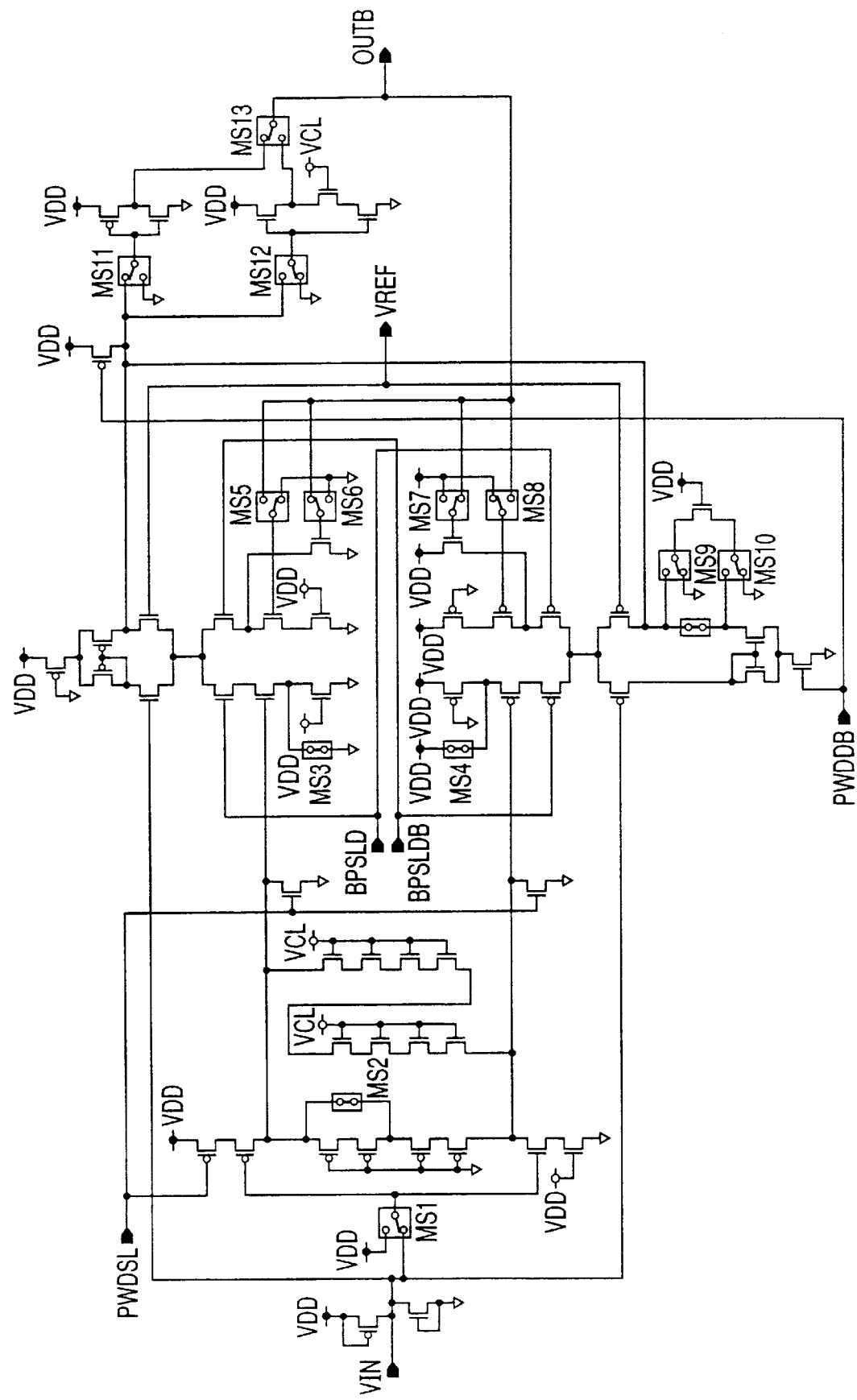
FIG. 22 is a diagram illustrating the input circuit according to another embodiment of the present invention.

FIG. 22 is a diagram illustrating the input circuit according to another embodiment of the present invention. The diagram shows a practical circuit of when the invention is adapted to the semiconductor integrated circuit device such as a dynamic RAM. Switches MS1 to MS13 based on a metal mask are added, and the power source voltage VDD is changed over to the version 3.3 V and the version 2.5 V to accomplish optimum constitutions. The switches MS2 to MS13 shown here are corresponding to the version 2.5 V.

In the case of the version 3.3 V, the switch is so changed as to insert the N-channel MOSFET in the circuit node to which a signal having a large amplitude is fed, or is cut, in order to cope with hot carriers in the MOSFET. Here, however, the switch MS1 is not for changing over the power source voltage VDD but for establishing the input circuit exclusively for the LVTTL as shown in FIG. 19. When the input circuit is produced exclusively for the LVTTL which needs not be changed over for the SSTL by using the bonding option due to the need in the market, the switch is used in combination with the bonding option to separate the full-amplitude current cut-off circuit from the input VIN, to decrease the load capacity of the input VIN, and to shorten the delay time.

Conversely, when the input circuit is produced exclusively for the SSTL and needs not be changed over for the LVTTL, the switches MS5 and MS6 are both changed over to the side of the ground voltage VSS and the switches MS7 and MS8 are both changed over to the power source voltage VDD, in order to realize an input circuit exclusively for the SSTL as shown in FIG. 20. By using these switches in combination with the bonding option, the feedback path from the output OUTB is removed, the load capacity of the output OUTB is decreased, and the delay time is shortened. The high-resistance MOSFETs in the full-amplitude current cut-off circuit are realized by a plurality of MOSFETs that are connected in series to accomplish a reasonable layout.

Figure 23:
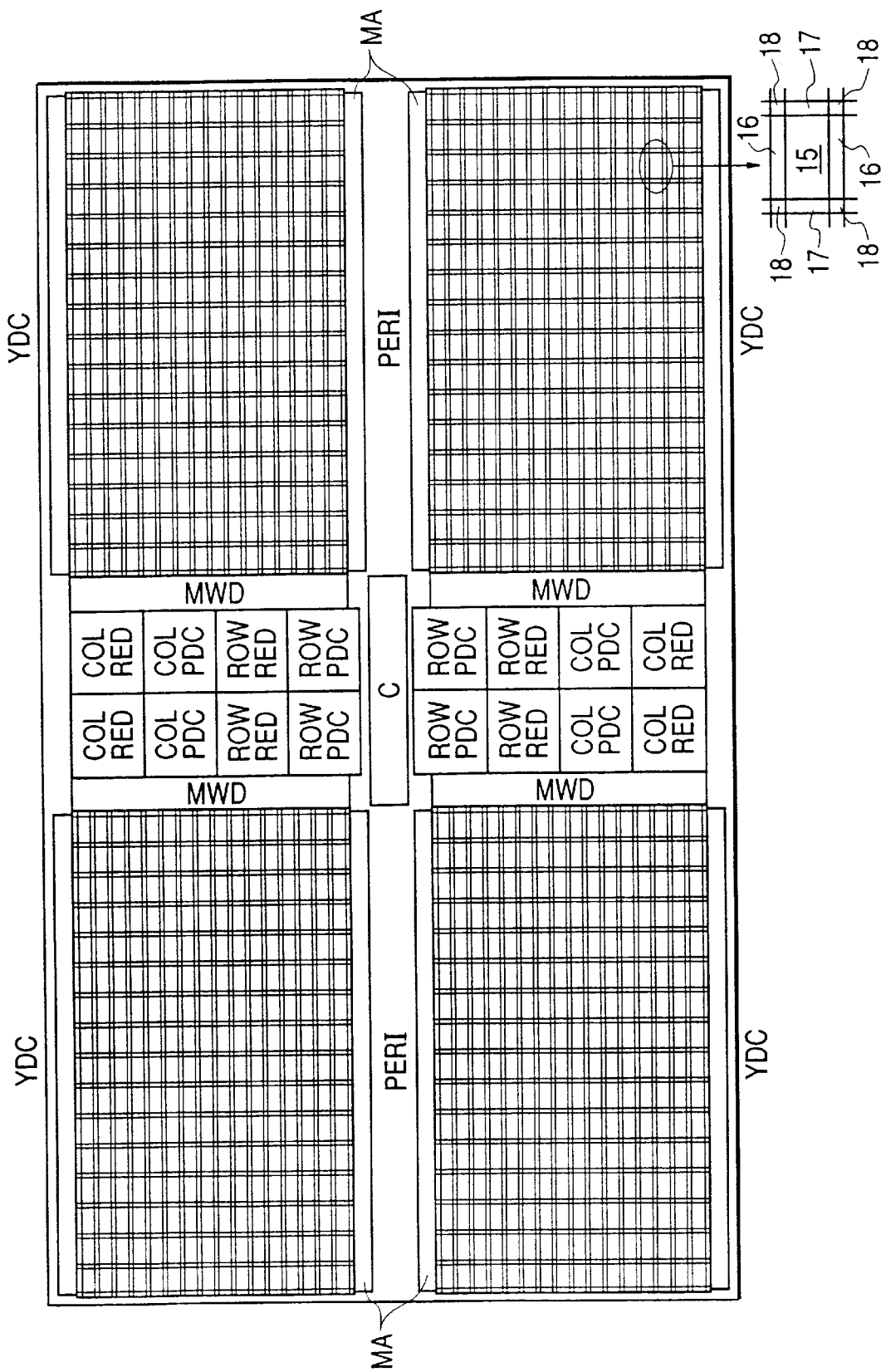
FIG. 23 is a diagram of layout schematically illustrating an embodiment of a dynamic RAM to which the present invention is applied.

FIG. 23 is a diagram of a layout schematically illustrating an embodiment of the dynamic RAM to which the present invention is adapted. Each circuit block is formed on a semiconductor substrate such as single crystalline silicon based on a known technology for producing semiconductor integrated circuits. The circuits in FIG. 23 are drawn to nearly meet the geometric arrangement on the semiconductor substrate. In this embodiment, the memory array as a whole is divided into four to constitute memory banks 0 to 3.

The memory banks 0 to 3 are corresponded to the memory arrays that have been divided into two up and down in the lengthwise direction of the semiconductor chip, and into two in the right-and-left direction. Peripheral circuits including address input circuits, data input/output circuits and bonding pad sequences, are provided in the central portion along the lengthwise direction of the chip. Though there is no particular limitation, the peripheral circuits include random logic circuits and bonding pads in parallel in order to rationalize the layout of the random logic circuits.

The peripheral circuits further include those that are not shown, such as a control circuit for controlling a boosted voltage-generating circuit and the operation thereof, a voltage-dividing circuit that divides the external power source voltage VDDQ into ½ to form a reference voltage for the input voltage constituted by a differential circuit, an input/output circuit and a clock control circuit therefor, a Y-predecoder and a read/write buffer, a voltage-lowering circuit for forming an operation voltage for the peripheral circuits, a VPP sensor for detecting whether the VPP voltage is a desired voltage or not, a stabilizing capacitor for stabilizing the lowered voltage VPERI, an X-address latching circuit, a Y-clock circuit, a mode decoder/clock buffer and a command circuit, a Y-counter and a control circuit therefor, a refresh control circuit, a bonding option circuit BOP, a power source closure detection circuit and the like circuits.

In the total of four memory arrays divided into two up and down in the lengthwise direction of the semiconductor chip and into two in the right-and-left direction as described above, the X-system predecoder circuits ROWPDC and relief circuits ROWRED as well as the Y-system predecoder circuits COLPDC and relief circuits COLRED are arranged compactly in an intermediate portion in the right-and-left direction relative to the lengthwise direction. That is, for the four memory arrays, there are provided the X-system predecoder circuits ROWPDC and relief circuits ROWRED as well as the Y-system predecoder circuits COLPDC and relief circuits COLRED in a number of two, respectively, for the memory arrays in a number of two on the right and left sides.

Main word driver regions MWD are formed along the intermediate portions of the memory arrays in the same manner as described above to drive the main word lines extending on the lower and upper sides corresponding to the respective memory arrays. When the similar subarrays are used in this constitution, the main word lines extend so as to penetrate through 16 subarrays. Though there is no particular limitation, Y-decoders YDC are provided on the peripheral sides of the chip opposite to the central portions of the chip in the memory arrays. That is, the memory arrays divided into four are sandwiched by the main amplifiers MA arranged on the central sides and the Y-decoders YDC arranged on the peripheral sides. In this case, the wiring channels extending in the longitudinal direction and in the transverse direction intersect at the central portion of the chip, and a stabilizing capacitor C is formed in this portion. Further, stabilizing capacitors of a small capacity are suitably formed in a dispersed manner in the gaps among the peripheral circuits.

In this embodiment, the memory arrays divided into four are arranged being sandwiched by the main amplifiers MA arranged on the central sides and the Y-decoders YDC arranged on the peripheral sides. Each memory array is divided into a plurality of subarrays 15 as one of them is shown on an enlarged scale. Each subarray 15 is surrounded by sense amplifier regions 16 and subword driver regions 17. Portions where the sense amplifier regions 16 are intersecting the subword driver regions 17 are the intersecting regions 18. The sense amplifiers provided in the sense amplifier regions 16 are constituted based on a shared sense system. Complementary bit lines are provided on the right and left sides with the sense amplifier as a center except the sense amplifiers arranged at both ends of the memory cell arrays, and are selectively connected to the complementary bit lines of either the right or left memory cell arrays.

Each subarray 15 is constituted by, for example, 256 subword lines and 256 pairs of complementary bit lines (or data lines) intersecting at right angles, that are not shown. The subarray is provided with spare word lines and spare complementary bit lines for relieving defective word lines or defective bit lines. In each memory array, the subarrays are provided in a number of 16 in the direction in which the word lines are arranged and, hence, the subword lines as a whole are provided in a number of about 4 K. The subarrays are further provided in a number of 16 in the direction in which the bit lines are arranged and, hence, the complementary bit lines as a whole are provided in a number of about 4 K. The memory arrays are provided in a number of four as a whole and, hence, have a memory capacity of 4×4K×4K= 64 megabits as a whole. Therefore, the length of the complementary bit lines is divided into 1/16 to correspond to the subarrays of the number of 16. The length of the subword lines is divided into 1/16 to correspond to the subarrays of the number of 16.

A subword driver (subword line drive circuit) 17 is provided for every subarray 15 in the memory array. The length of the subword driver 17 is divided into 1/16 relative to the main word line and forms a selection signal of the subword line that extends in parallel therewith. In this embodiment, in order to decrease the number of the main word lines or, in other words, to relax the pitch among the main word lines, though there is no particular limitation, four subword lines are arranged in the direction of the complementary bit lines for each main word line. A subword selection driver that is not shown is arranged in the main word driver MWD in order to select a subword line out of the subword lines that are divided into eight in the direction of the main word lines and are assigned in a number of four in the direction of the complementary bit lines. The subword selection driver forms a selection signal for selecting one subword line selection out of the four subword selection lines extending in the direction in which the subword driver is arranged.

In employing the layout shown in FIG. 23, a Y-address that is input is transmitted to the relief circuits provided in the intermediate portion of the memory arrays through the address buffer ADDBUP and to the Y-decoders YDC arranged on the peripheral sides of the chip through the predecoders, and a Y-selection signal is formed. Complementary bit lines of a subarray are selected by the Y-selection signal, and the signal is transmitted to the main amplifier MA on the central side of the chip which is on the opposite side, and is amplified and is output through the output circuit that is not shown.

This constitution may so appear that an extended period of time is required before the read signal is output passing around in the chip. However, the address signal must be directly input to the relief circuit. If the relief circuit is arranged anywhere at the center of the chip, the output time of the predecoder is determined after the judgement is rendered concerning whether the address is defective or not. That is, if the predecoder and the relief circuit are separated away from each other, the delay in the signal becomes a cause of delaying the practical Y-selection operation.

In this embodiment, the main amplifiers MA and the Y-decoders YDC are arranged on both sides of the memory arrays. Therefore, the sum of the signal transmission path for selecting the complementary bit lines of the subarray and the signal transmission path from the selected complementary bit lines to the input of the main amplifier MA through the input/output line, is a signal transmission path that only traverses the memory array no matter which complementary bit lines are selected, and becomes one-half that of the device that undergoes the round trip. Thus, the memory becomes accessible at a high speed.

Figure 24:
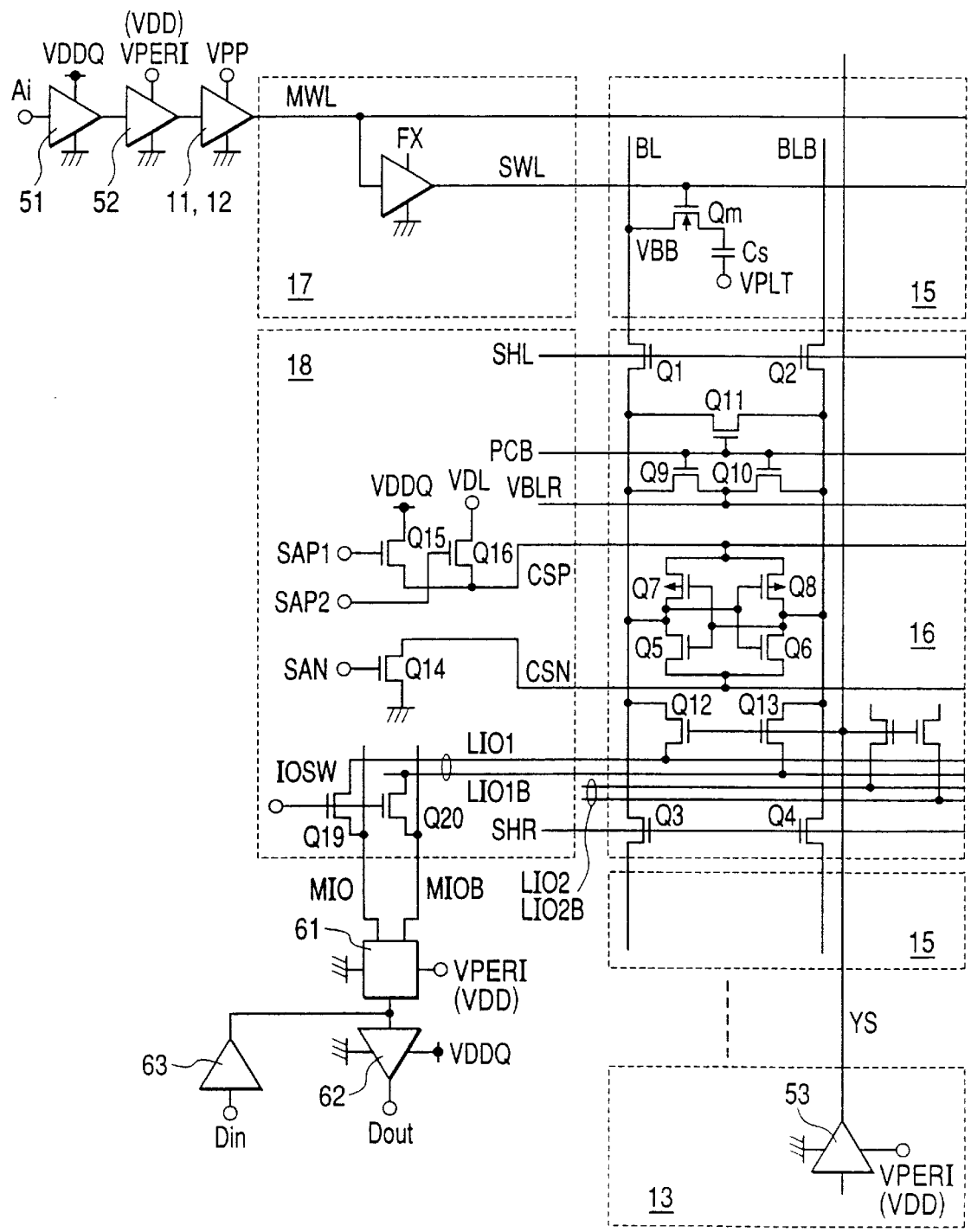
FIG. 24 is a circuit diagram schematically illustrating the input of address through up to the output of data with the sense amplifier unit of the dynamic RAM as a center according to an embodiment of the present invention.

FIG. 24 is a diagram illustrating an embodiment of the invention in which the address input through up to the data output are simplified with the sense amplifier portion of the dynamic RAM as a center. FIG. 24 illustrates the sense amplifier 16 sandwiched by the two subarrays 15 from the upper and lower sides and a circuit provided in the intersecting area 18, other circuits being shown as blocks. A dynamic memory cell is representatively shown being provided between a subword line SWL in a subarray 15 and a bit line BL between the complementary bit lines BL and BLB. The dynamic memory cell is constituted by an address selection MOSFET Qm and a storage capacitor Cs. The gate of the address selection MOSFET Qm is connected to the subword line SWL, the drain of the MOSFET Qm is connected to the bit line BL, and a storage capacitor Cs is connected to the source thereof. The other electrode of the storage capacitor Cs is in common and is served with a plate voltage VPLT. A negative back bias voltage VBB is applied to the substrate (channel) of the MOSFET Qm. Though there is no particular limitation, the back bias voltage VBB is set to a voltage such as −1 V. The selection level for the subword line SWL is set to a high voltage VPP that is higher than the high level of the bit line by the threshold voltage of the address selection MOSFET Qm.

When the sense amplifier is operated by the internal lowered voltage VDL, the high level amplified by the sense amplifier and is given to the bit line assumes the internal voltage VDL level. Therefore, the high voltage VPP corresponding to the selection level for the word line is VDL+ Vth+α. The pair of complementary bit lines BL and BLB of the subarray provided on the left side of the sense amplifier are arranged in parallel as shown. The complementary bit lines BL and BLB are connected to the input/output nodes of a unit circuit of the sense amplifier through the shared switching MOSFETs Q1 and Q2.

The unit circuit of the sense amplifier is constituted by a CMOS latch circuit comprising N-channel amplifier MOSFETs Q5, Q6 in the form of a latch with their gates and drains being connected together in a crossing manner, and P-channel amplifier MOSFETs Q7, Q8. The sources of the N-channel MOSFETs Q5 and Q6 are connected to a common source line CSN. The sources of the P-channel MOSFETs Q7 and Q8 are connected to a common source line CSP. Power-switching MOSFETs are connected to the common source lines CSN and CSP. Though there is no particular limitation, an operation voltage corresponding to the ground potential is given from the N-channel power-switching MOSFET Q14 provided in the crossing area 18 to the common source line CSN to which are connected the sources of the N-channel amplifier MOSFETs Q5 and Q6.

Though there is no particular limitation, an N-channel power MOSFET Q15 for overdriving and an N-channel power MOSFET Q16 for feeding the internal voltage VDL provided in the crossing area 18, are connected to the common source line CSP to which are connected the sources of the P-channel amplifier MOSFETs Q7 and Q8. Though there is no particular limitation, the power source voltage VDDQ fed through the external terminal is used as the voltage for overdriving. Or, in order to reduce the dependency of the operation speed of the sense amplifier upon the power source voltage VDDQ, the voltage may be slightly decreased by obtaining the voltage from the source of the N-channel MOSFET that is served with VPP through the gate thereof and with the power source voltage VDDQ through the drain thereof.

An activating signal SAP1 for overdriving the sense amplifier supplied to the gate of the N-channel power MOSFET Q15 is in phase with an activating signal SAP2 fed to the gate of the N-channel MOSFET Q16. The input circuit for receiving the input signal fed from the SA external terminal comprises a combination of a first differential amplifier circuit that includes differential MOSFETs of a first type of electric conduction and a first MOSFET of the first type of electric conduction provided for the common sources thereof to form an operation current, a second differential amplifier circuit that includes differential MOSFETs of the second type of electric conduction and a second MOSFET of the second type of electric conduction provided for the common sources thereof to form an operation current, and an inverter circuit for forming an output signal, wherein an input signal from the external terminal is fed to the input terminals of one side of said first and second differential amplifier circuits, a reference voltage which is nearly an intermediate voltage between the high level and the low level of the input signal is fed to the input terminals on the other side of said first and second differential amplifier circuits, the output signals of said first and second differential amplifier circuits which are in phase are synthesized together and are fed to the input terminal of the inverter circuit. P1 and SAP2 assume the high level in time series. Though there is no particular limitation, SAP1 and SAP2 of the high level are signals of the boosted voltage VPP level. That is, the boosted voltage VPP is about 3.6 V which is high enough for turning the N-channel MOSFETs Q15 and Q16 on. After the MOSFET Q15 is turned off (signal SAP1 has assumed the low level), a voltage corresponding to the internal voltage VDL is output from the source side as the MOSFET Q16 is turned on (signal SAP2 assumes the high level).

At the input/output nodes of the unit circuit of the sense amplifier, there are provided an equalizer MOSFET Q11 for short-circuiting the complementary bit lines, and a precharging (equalizer) circuit comprising switching MOSFETs Q9 and Q10 for supplying a half precharging voltage VBLR to the complementary bit lines. The gates of the MOSFETs Q9 to Q11 are commonly served with a precharging signal PCB. Though not diagrammed, the driver circuit for forming the precharging signal PCB is realized by providing an inverter circuit in the crossing area so that the signal is allowed to rise or break at high speeds. That is, at the start of access to the memory, the MOSFETs Q9 to Q11 constituting the precharging circuit are changed over at high speeds through the inverter circuits provided in a dispersed manner in the crossing areas prior to the word line selection timing.

In the crossing area 18 is placed an IO switching circuit IOSW (switching MOSFETs Q19 and Q20 for connecting local IO and main IO). In addition to the circuits shown in FIG. 3, there are provided, as required, half-precharging circuits for the common source lines CSP and CSN of the sense amplifiers, half-precharging circuits for the local input/output lines LIO, VDL precharging circuits for the main input/output lines, and dispersed driver circuits for the shared selection signal lines SHR and SHL.

The unit circuit of the sense amplifier is connected to the similar complementary bit lines BL, BLB of the subarray 15 on the lower side in the drawing through shared switching MOSFETs Q3 and Q4. For example, when the subword line SWL of the subarray of the upper side is selected, the upper shared switching MOSFETs Q1 and Q2 of the sense amplifier are turned on, and the lower shared switching MOSFETs Q3 nd Q4 are turned off. The switching MOSFETs Q12 and Q13 constitute a column (Y)-switching circuit, and are turned on when the selection signal YS assumes the selection level (high level) to connect the input/output nodes of the unit circuit of the sense amplifier to the local input/output lines LIO1, LIO1B, LI02, LIO2B, etc.

Then, the input/output nodes of the sense amplifier are connected to the complementary bit lines BL, BLB of the upper side to amplify a very small signal of the memory cell connected to the selected subword line SWL, and to transmit it to the local input/output lines LIO, LIO1B through the column-switching circuit (Q12 and Q13). The local input/output lines LIO1 and LIOB are extending along the sense amplifier sequence, i.e., are extending in the transverse direction in the drawing. The local input/output lines LIO1 and LIO1B are connected to the main input/output lines MIO, MIOB to which are connected the input terminals of the main amplifier 61 through an IO-switching circuit comprising N-channel MOSFETs Q19 and Q20 formed in the crossing area 18.

The IO-switching circuit is controlled for its switching operation by a selection signal formed by decoding an address signal of the X-system. The IO-switching circuit may assume a CMOS switching constitution in which the P-channel MOSFETs are connected in parallel with the N-channel MOSFETs Q19 and Q20. In a burst mode of the synchronous DRAM, the column selection signal YS is changed over by the counter operation, and the connections of the local input/output lines LIO, LIO1B, LIO2, LIO2B and the two pairs of complementary bit lines BL, BLB of the subarray are changed over successively.

An address signal Ai is fed to an address buffer 51. The address buffer operates time-divisionally to receive an X-address signal and a Y-address signal. The X-address signal is fed to a predecoder 52, and a signal for selecting the main word line MWL is formed through a main row decoder 11 and a main word driver 12. The address buffer 51 receives the address signal Ai fed through the external terminal, and is operated by the power source voltage VDDQ fed through the external terminal. The predecoder is operated by a lowered voltage VPERI (VDD) obtained by lowering the power source voltage, and the main word driver 12 is operated by the boosted voltage VPP. As the main word driver 12, there is used a logic circuit with a level conversion function that receives the predecoded signal. A column decoder (driver) 53 includes a drive circuit in which a MOSFET Q23 constituting the VCLP-generating circuit forms an operation voltage, and forms the selection signal YS upon receiving a Y-address signal fed by the time-divisional operation of the address buffer 51.

The main amplifier 61 is operated by the lowered voltage VPERI (VDD) and produces an output from an external terminal Dout through an output buffer 62 operated by the power source voltage VDDQ fed through an external terminal. A write signal input through the external terminal Din is received through the input buffer 63, and is fed to the main input/output lines MIO and MIOB through a write amplifier (write driver) included in the main amplifier 61 in FIG. 24. The input unit of the output buffer 62 is provided with a level conversion circuit and a logic unit for producing the output signal in synchronism with a timing signal corresponding to the clock signal.

Though there is no particular limitation, the power source voltage VDDQ fed through the external terminal assumes 3.3 V in the first, the lowered voltage VPERI (VDD) fed to the internal circuit is set to 2.5 V, and the operation voltage VDL of the sense amplifier is set to 1.8 V. The selection signal (boosted voltage) of the word line is set to 3.6 V. The precharging voltage VBLR of the bit line is set to 0.9 V that corresponds to VDL/2, and the plate voltage VPLT is set to 0.9 V. The substrate voltage VBB is set to −1.0 V. The power source voltage VDDQ fed through the external terminal may be set to a low voltage of, for example, 2.5 V as in the second form. In the case of this low power source voltage VDDQ, the lowered voltage VPERI (VDD) and the lowered voltage VDL may be set to be nearly 1.8 V.

Or, the power source voltage VDDQ fed through the external terminal may be set to be 3.3 V, and the lowered voltage VPERI (VDD) fed to the internal circuit and the operation voltage VDL of the sense amplifier may be set to be 2.0 V or 1.8 V. As described above, the internal voltage may take various forms relative to the external power source voltage VDDQ.

Figure 25:
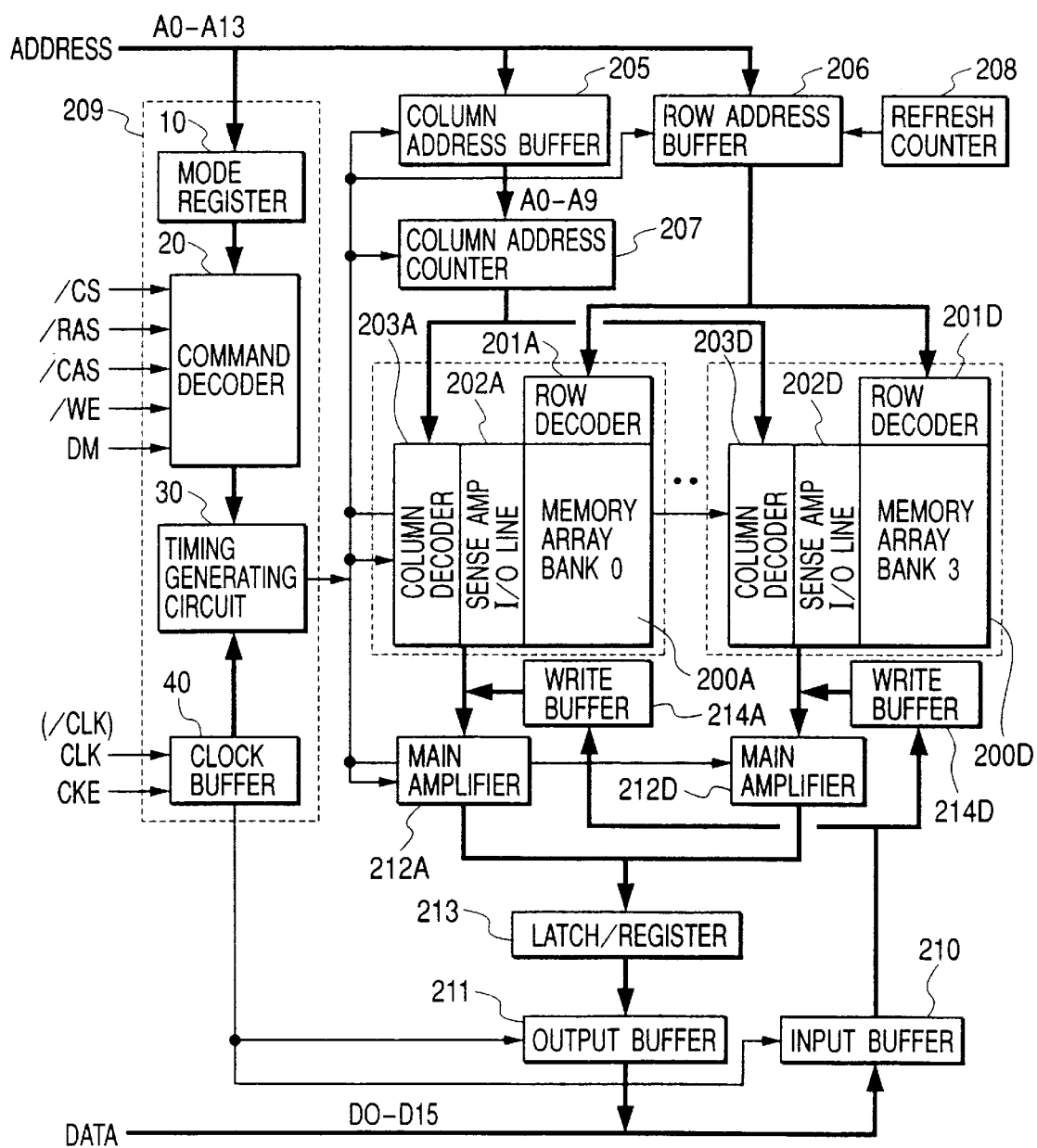
FIG. 25 is a whole block diagram illustrating an embodiment of the SDRAM to which the present invention is applied.

FIG. 25 is a block diagram illustrating the whole synchronous DRAM (hereinafter simply referred to as SDRAM) of about 64 megabits according to an embodiment of the present invention. Though there is no particular limitation on the SDRAM of this embodiment, there are shown a memory array 200A constituting a memory bank 0 and a memory array 200D constituting a memory bank 3 among the four memory banks.

That is, among the four memory banks, the memory arrays 200B and 200C corresponding to the two memory banks 1 and 2 are not shown here. The memory arrays 200A to 200D corresponding to the four memory banks 0 to 3 are equipped with dynamic memory cells arranged in the form of a matrix like the memory arrays 200A and 200D that are shown, wherein the selection terminals of the memory cells arranged along the same column are connected to a word line (not shown) of each column, and the data input/output terminals of the memory cells arranged along the same row are connected to the complementary data lines (not shown) of each row.

In the memory array 200A, one of the word lines that are not shown is driven to the selection level according to the result of decoding the row address signal by a row decoder 201A. The complementary data lines that are not shown of the memory array 200A are connected to the I/O lines 202A that include sense amplifiers and column selection circuits. The sense amplifiers in the I/O lines 202A including sense amplifiers and column selection circuits are amplifier circuits that detect and amplify a very small potential difference appearing on the complementary data lines as the data are read out from the memory cells. The column switching circuits are for selecting the complementary data lines and for permitting them to be conductive to the complementary I/O lines. The column switching circuits are selectively operated according to the result of decoding the column address signals by the column decoder 203A.

Similarly, the memory arrays 200B to 200D are provided with a row decoder 201D, I/O lines 202D including sense amplifiers and column selection circuits, and a column decoder 203D as represented by the memory array 200D. The complementary I/O lines are connected to the output terminals of the write buffers 214A, B and to the input terminals of the main amplifiers 212A, D. The output signals of the main amplifiers 212A, D are transmitted to the input terminal of a latch/register 213. The output signal of the latch/register 213 is produced from an external terminal through an output buffer 211.

The write signal input through the external terminal is transmitted to the input terminals of the write buffers 214A, D through an input buffer 210. Though there is no particular limitation, the external terminals are the data input/output terminals for outputting data D0 to D15 consisting of 16 bits. Main amplifiers and write buffers similar to those described above are provided for the memory arrays 200B, C that are not shown.

The address signals A0 to A13 fed through the address input terminal are received in the form of an address multiplex by a column address buffer 205 and a row address buffer 206. The address signals that are fed are held by the respective buffers. In the refresh operation mode, the row address buffer 206 receives a refresh address signal output from a refresh counter 208 as a row address signal. The output of the column address buffer 205 is fed as a preset data of a column address counter 207. Depending upon the operation mode designated by a command that will be described later, the column address counter 207 sends the column address signals which are the preset data or values obtained by successively increasing the column address signals, to the column decoders 203A to 203D.

In FIG. 25, though there is no particular limitation, a controller 209 represented by a dotted line receives external control signals such as clock signal CLK, clock enable signal CKE, chip select signal /CS, column address strobe signal /CAS (signals with a symbol / are row enable signals), row address strobe signal /RAS and write enable signal /WE, as well as control data through the address input terminals A0 to A11, and forms internal timing signals for controlling the operation mode of the SDRAM and the operation of the circuit blocks based on the changes in the levels of these signals and on the timings thereof. The controller 209 includes a mode register 10, a command decoder 20, a timing-generating circuit 30 and a clock buffer 40.

The clock signal CLK is input to the clock synchronizing circuit 50 described above via the clock buffer 40 thereby to generate an internal clock. Though there is no particular limitation, the internal clock is used as a timing signal for activating the output buffer 211 and the input buffer 210, and is fed to the timing-generating circuit 30. Based on the clock signal, there is formed a timing signal fed to the column address buffer 205, row address buffer 206 and column address counter 207.

The other external input signals are signified in synchronism with the rising edge of the internal clock signal. The chip select signal /CS having the low level instructs the start of the command input cycle. The chip select signal /CS having the high level (chip is not selected) and other inputs have no meaning. However, the memory bank selection state and the internal operation such as the burst operation that will be described later are not affected by a change into the chip non-selected state. The signals /RAS, /CAS and /WE have functions different from the corresponding signals in the normal DRAM, and become significant for defining the command cycle that will be described later.

The clock enable signal CKE is for instructing the validity of the next clock signal. When the signal CKE has the high level, the rising edge of the next clock signal CLK becomes effective. When the signal CKE has the low level, the rising edge becomes ineffective. In the read mode, when an external control signal /OE is provided for controlling the output enable for the output buffer 211, this signal /OE is fed to the controller 209. When the signal has, for example, the high level, the output buffer 211 assumes the high output impedance state.

The row address signal is defined by the level of A0 to A11 in the row address strobe bank active command cycle that will be described later that varies in synchronism with the rising edge of the clock signal CLK (internal clock signal).

The address signals A12 and A13 are regarded as bank selection signals in the above-mentioned row address strobe bank active command cycle. That is, any one of the four memory banks 0 to 3 is selected based on the combination of A12 and A13. Though there is no particular limitation, the memory banks are selected by activating only those row decoders on the side of the selected memory bank, selecting none of the column switching circuits on the side of the non-selected memory bank, or making connection to only those input buffers 210 and output buffers 211 on the side of the selected memory bank.

The column address signal is defined by the levels of A0 to A9 in the read or write command (column address read command, column address write command that will be described later) cycle in synchronism with the rising edge of the clock signal CKL (internal clock). The thus defined column address serves as a start address for the burst access.

Described below are the main operation modes of the SDRAM instructed by the following commands.

(1) Mode Register Set Command (Mo)

This is the command for setting the mode register 30, and is designated by /CS, /RAS, /CAS, /WE=low level, and the data (register set data) to be set are given through A0 to A11. Though there is no particular limitation, the register set data work as burst length, CAS latency or write mode. Though there is no particular limitation, the burst length that can be set is 1, 2, 4, 8 or full pages, the CAS latency that can be set is 1, 2 or 3, and the write mode that can be set is a burst write or a single write.

The CAS latency instructs the internal clock signals of how many cycles be used in the reading operation instructed by the column address read command that will be described later from the break of /CAS to the output operation of the output buffer 211. The internal operation time for reading the data is needed until the read data are determined, and is set depending on the frequency of the internal clock signals. In other words, when the internal clock signals of a high frequency are used, the CAS latency is set to a relatively large value. When the internal clock signals of a low frequency are used, the CAS latency is set to a relatively small value.

(2) Row Address Strobe Bank Active Command (Ac)

This is a command for validating the instruction of the row address strobe and the selection of the memory bank by A12 and A13, and is instructed by /CS, /RAS=low level, and /CAS, /WE=high level. At this moment, the address fed to A0 to A9 are received as a row address signal, and the signals fed to A12 and A13 are received as a memory bank selection signal. The receiving operation is carried out in synchronism with the rising edge of the internal clock signal as described above. For example, when the command is specified, a word line in the specified memory bank is selected, and the memory cells connected to the selected word line are permitted to be conductive to the corresponding complementary data lines.

(3) Column Address Read Command (Re)

This command is necessary for starting the burst read operation and gives a column address strobe instruction. This command is instructed by /CS, /CAS=low level, /RAS, /WE=high level and, at this moment, the column address fed to A0 to A7 (×16 bits constitution) is received as a column address signal. The column address signal that is received is fed as a burst start address to the column address counter 207.

In the thus instructed burst read operation, the memory bank and the word line therein have been selected in the row address strobe bank active command cycle. Therefore, the memory cells of the selected word line are successively selected and are consecutively read out according to the address signals output from the column address counter 207 in synchronism with the internal clock signals. The number of the data consecutively read out is the number specified by the burst length. The data are read out from the output buffer 211 after having waited for the number of the cycles of the internal clock signals specified by the CAS latency.

(4) Column Address Write Command (Wr)

When a burst write has been set to the mode register 10 as a mode of writing operation, this is a command necessary for starting the burst write operation. When a single write has been set to the mode register 10 as a mode of writing operation, this is a command necessary for starting the single write operation. Further, the command gives a column address strobe instruction in the single write and in the burst write.

The command is instructed by the /CS, /CAS, /WE=low level, /RAS=high level. At this moment, the address fed to A0 to A9 is received as a column address signal. In the burst write, the thus received column address signal is fed to the column address counter 207 as a burst start address. The procedure of the thus specified burst write operation is carried out in the same manner as the burst read operation. However, the writing operation includes no CAS latency, and the write data are taken starting from the column address write command cycle.

(5) Precharge Command (Pr)

This is a command for starting the precharging operation for the memory bank selected by A12 and A13, and is instructed by /CS, /RAS, /WE=low level, and /CAS=high level.

(6) Automatic Refresh Command

This is a command necessary for starting the automatic refresh, and is instructed by /CS, /RAS, /CAS=low level, and /WE, CKE=high level.

(7) Burst Stop in Full-page Command.

This is a command necessary for halting the burst operation for full pages in all memory banks, and is neglected in the burst operation other than full pages. This command is instructed by /CS, /WE=low level, /RAS, /CAS=high level.

(8) No Operation Command (Nop)

This is a command for instructing not to substantially carry out the operation, and is instructed by /CS=low level, /RAS, /CAS, /WE=high level.

While the burst operation is being carried out in a memory bank in the SDRAM, when another memory bank is designated in the midst thereof and a row address strobe bank active command is supplied, the operation of the row address system can be carried out in the another memory bank without at all affecting the operation of the memory bank that is now in operation. For instance, the SDRAM has a means for holding therein the data, address and control signal fed from an external unit. Though there is no particular limitation, the contents are held and, particularly, the address and control signal are held for each of the memory banks. Or, the data of one word line in the memory block selected by the row address strobe bank active command cycle, are held by the latch/register 213 for executing the reading operation prior to operating the column system.

Therefore, so far as the data D0 to D15 do not collide at the 16-bit data input/output terminals, the internal operation can be started in advance by issuing a precharge command and a row address strobe bank active command for a memory bank different from the memory bank that is to be processed by the command that is now being executed. In the SDRAM of this embodiment, the memory is accessed in a unit of 16 bits as described above, the addresses of about 1 M are possessed relying on the addresses A0 to A11, and the four memory banks are constituted thereby to possess the storage capacity of about 64 megabits (1M×4 banks×16 bits) as a whole.

Figure 26:
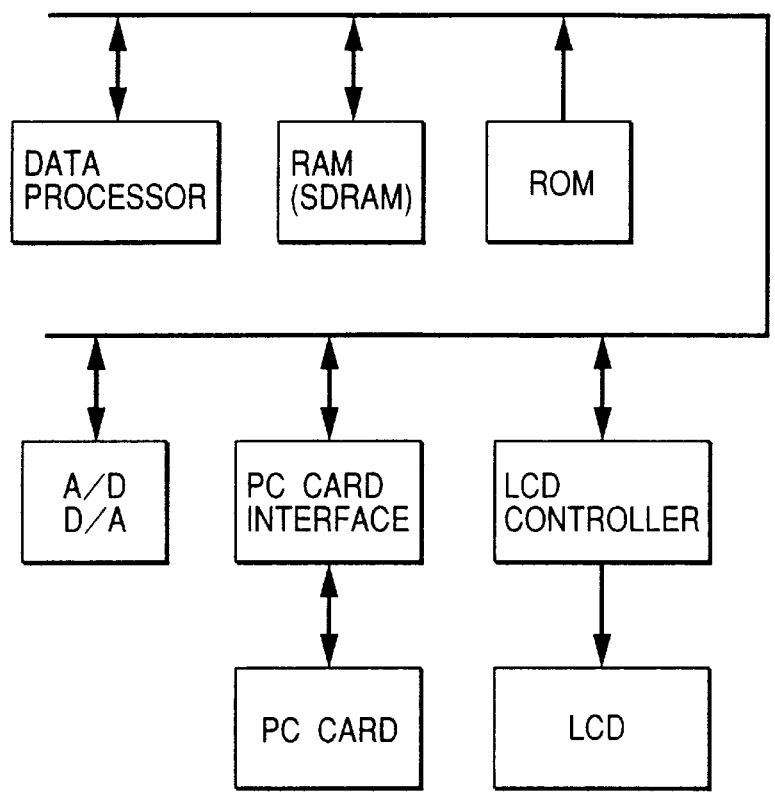
FIG. 26 is a block diagram illustrating an embodiment of a microcomputer system to which the present invention is applied.

FIG. 26 is a block diagram illustrating an embodiment of a microcomputer system to which the present invention is adapted. Though there is no particular limitation, the microcomputer system of this embodiment is constituted as a portable electronic device powered by cells.

This microcomputer system comprises a data processing unit (central processing unit) as a center to which are connected peripheral units such as RAM (random access memory: SDRAM), ROM (read-only memory), analog/digital converter circuit A/D and digital/analog converter circuit D/A, PC card interface, LCD controller and the like through a system bus.

Upon inserting a PC card in the slot, the PC card interface is electrically connected enabling the data to be written and read out. The PC card is used as a detachable external storage unit. Upon receiving the display data from the data processor, the LCD controller drives the liquid crystal display device LCD to effect the display operation.

Though there is no particular limitation, the data processor is constituted in the same manner as the so-called microprocessor. That is, though the details are not diagrammed, the data processor includes an instruction register, a microinstruction ROM that decodes the instruction written into the instruction register and forms various microinstructions or control signals, an operation circuit, a general-purpose register (RG 6, etc.), a bus driver connected to the internal bus BUS, and input/output circuit such as bus receiver.

The data processor reads an instruction stored in the read-only memory ROM and executes the operation corresponding to the instruction. The data processor receives the external data input through the input/output circuit, inputs data to, and outputs data from, the control circuit, reads instructions or data such as fixed data necessary for executing the instructions from the read-only memory ROM, supplies data to be subjected to the D/A conversion to the D/A converter circuit, reads the data subjected to the A/D conversion by the A/D converter circuit, reads the data fed to the RAM comprising a dynamic memory, and controls the writing operation.

In the above-mentioned microcomputer system, the semiconductor integrated circuit devices including the RAM of the present invention can be connected even when the system bus is the above-mentioned LVTTL, LVCMOS or SSTL. Even when the system bus is changed to the above-mentioned high-speed SSTL in order to enhance the function, the conventional semiconductor integrated circuit devices can be used without modification provided the semiconductor integrated circuit devices are each provided with the input circuit of the present invention.

Figure 27:
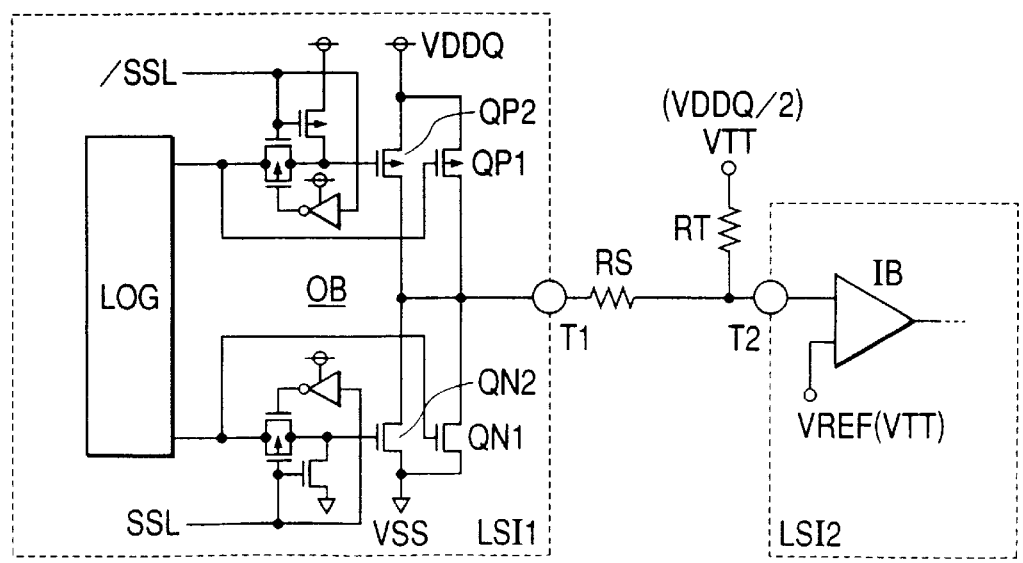
FIG. 27 is a diagram illustrating an embodiment of an output circuit in the semiconductor integrated circuit device according to the present invention.

FIG. 27 is a diagram of an output circuit of the semiconductor integrated circuit device according to an embodiment of the present invention. FIG. 27 illustrates an output circuit adapted to the SSTL and a signal line (bus) corresponding thereto. In either the case of LVTTL or the case of LVCMOS and SSTL, the output circuit is constituted by a P-channel output MOSFET and an N-channel output MOSFET. In the SSTL, a final resistance RT of 50Ω is provided through a resistance RS of, for example, 25Ω. The final resistance RT is connected to a voltage VTT corresponding to VDDQ/2. The SSTL and the LVTTL have different output constants.

In order to realize the above-mentioned two output constants, the two P-channel MOSFETs QP1 and QP2, and the N-channel MOSFETs QN1 and QN2 are connected in parallel, and the MOSFETs QP1 and PN1 are formed for the SSTL in order to feed a signal that is formed by the internal circuit LOG and that is to be output. Signals to be output are selectively fed to the gates of the other P-channel MOSFET QP2 and the N-channel MOSFET QN2 through the CMOS switch as mentioned above. To execute the output operation corresponding to the SSTL, the control signal SSL is rendered to assume the high level, /SSL is rendered to assume the low level, whereby the CMOS switch is turned off. Further, the power source voltage VDDQ is fed to the gate of the output MOSFET QP2, and the ground potential VSS of the circuit is fed to the gate of the N-channel MOSFET QN2. During the output operation corresponding to the SSTL, therefore, the output MOSFETs QP1 and QN1 only are operated.

To execute the output operation corresponding to the LVTTL and LVCMOS, the resistances RS and RT are omitted, the control signal SSL is rendered to assume the low level, /SSL is rendered to assume the high level, and the CMOS switch is turned on. Accordingly, the gate of the output MOSFET QP2 and the gate of the N-channel MOSFET QN2 are connected to the gate of the P-channel MOSFET QP1 and to the gate of the N-channel MOSFET QN1 to transmit the same signals that are to be output. During the output operation corresponding to the LVTTL or the LVCMOS, therefore, the output MOSFETs QP1, QP2 and QN1, QN2 operate in parallel to form a large output current.

In its simplest way, the signal SSL(/SSL) is formed from a change-over signal fed through the external terminal. Or, instead, the input signal level may be detected to automatically generate the signal SSL(/SSL). Or the signal may be changed over relying on the bonding option.

The following actions and effects are obtained from the above-mentioned embodiment.

(1) Differential amplifier circuits that receive input signals fed through external terminals are served with a first operation voltage and a second operation voltage through a first switching MOSFET and a second switching MOSFET, said first and second switching MOSFETs are turned on by a bias voltage-generating circuit when said input signal is near a central voltage of said first and second operation voltages, control voltages are formed to turn either said first switching MOSFET or said second switching MOSFET on and to turn the other one off to produce a corresponding output signal when the input signal continuously assumes said first voltage or said second voltage for a predetermined period of time, thereby to supply an input signal of a first amplitude corresponding to said first operation voltage and said second operation voltage as well as an input signal of a second amplitude corresponding to a predetermined intermediate voltage between said first operation voltage and said second operation voltage. Thus, the input circuit is simplified, management and handling of the products is facilitated, and the consumption of electric power is substantially decreased.

(2) As the differential amplifier circuit, a load MOSFET of the second type of electric conduction in the form of a current mirror is provided on the drain side of the differential MOSFETs of the first type of electric conduction that receive the input signal and the reference voltage corresponding to the logic threshold voltage thereof, and a constant-current MOSFET of the first type of electric conduction served with a constant voltage through the gate thereof is provided on the common source side of the differential MOSFETs. Therefore, the input circuit is simplified, management and handling of the products is facilitated, the consumption of electric power is substantially decreased and, besides, the level of the input signals is stably judged.

(3) The second switching MOSFET of the second type of electric conduction is connected to the load MOSFET of the second type of electric conduction, and the first switching MOSFET of the first type of electric conduction is connected to the constant-current MOSFET of the first type of electric conduction. Therefore, the input circuit is simplified, management and handling of the products is facilitated, the consumption of electric power is substantially decreased and, besides, the level of the input signals is stably judged.

(4) The bias voltage-generating circuit uses a series circuit comprising a third MOSFET of the first type of electric conduction served with said input signal through the gate thereof and served with said first operation voltage through the source thereof, a fourth MOSFET of the second type of electric conduction served with said input signal through the gate thereof and served with said second operation voltage through the source thereof, and a high-resistance means provided between the drain of said third MOSFET and the drain of the fourth MOSFET, wherein a control voltage to be fed to the gate of said second switching MOSFET is output from the drain of said third MOSFET, and a control voltage to be fed to the gate of said first switching MOSFET is output from the drain of said fourth MOSFET. By using the differential amplifier circuit, therefore, there are supplied an input signal of a first amplitude corresponding to the first operation voltage and the second operation voltage, and an input signal of a second amplitude corresponding to a predetermined intermediate voltage between the first operation voltage and the second operation voltage, and the operation current is decreased when the signal of the first amplitude is input.

(5) The high-resistance means is fed with operation voltages through the gates thereof so as to be turned on, and is constituted by two MOSFETs of the first type of electric conduction and the second type of electric conduction arranged in parallel. This makes it possible to supply an input signal of the first amplitude corresponding to the first operation voltage and to the second operation voltage, and an input signal of the second amplitude corresponding to a predetermined intermediate voltage between the first operation voltage and the second operation voltage, and to efficiently decrease the operation current in the differential amplifier circuit when the signal of the first amplitude is input.

(6) The bias voltage-generating circuit comprises a third MOSFET of the first type of electric conduction served with said input signal through the gate thereof and served with said first operation voltage through the source thereof, a fourth MOSFET of the second type of electric conduction served with said input signal through the gate thereof and served with said second operation voltage through the source thereof, and a first high-resistance means and a second high-resistance means provided between the drain of said third MOSFET and the drain of said fourth MOSFET, wherein a control voltage to be fed to the gates of said first and second switching MOSFETs is output from a point where said first and second high-resistance means are connected together. This makes it possible to decrease the size of the high-resistance elements in the bias circuit, to operate the switching MOSFET using an intermediate potential between the node PIN and the node NIN and, hence, to improve CMRR.

(7) The bias voltage-generating circuit is constituted by a CMOS circuit comprising a third MOSFET of the first type of electric conduction served with said input signal through the gate thereof and served with said first operation voltage through the source thereof, a MOSFET of the second type of electric conduction constituting a high-resistance element and is served with said input signal through the gate thereof and served with said second operation voltage through the source thereof, a fourth MOSFET of the second type of electric conduction served with said input signal through the gate thereof and served with said second operation voltage through the source thereof, and a MOSFET of the first type of electric conduction constituting a high-resistance element and is served with said input signal through the gate thereof and is served with said first operation voltage through the source thereof. This makes it possible to decrease the size of the high-resistance elements in the bias circuit and to easily set the constants.

(8) The input signals fed to said input circuits comprise clock signals and a plurality of input signals fed in response thereto, and each of the input circuits that receive the input signals except the clock signals further comprises:

a circuit that forcibly turns off the two MOSFETs arranged in parallel to constitute high-resistance elements between said third MOSFET and said fourth MOSFET, and said constant-current MOSFET in a predetermined operation mode in which no input signal has been supplied from the external unit; and a MOSFET for fixing the output signal of the differential amplifier circuit to the first operation voltage or to the second operation voltage. This makes it possible to decrease the amount of electric power consumed by the input circuits in the standby mode in which the semiconductor integrated circuit devices are not substantially operating.

(9) An input circuit for a dynamic RAM including a plurality of word lines, a plurality of bit lines arranged to intersect therewith, and memory cells comprising address selection MOSFETs provided at predetermined points where said plurality of word lines intersect said plurality of bit lines and are connected to the corresponding word lines through the gates thereof, and memory capacitors connected between the corresponding bit lines and the pre determined potential via said address selection MOSFETs. This makes it possible to easily manage the products and to substantially decrease the consumption of electric power.

(10) An input circuit for a dynamic RAM including a plurality of word lines, a plurality of bit lines arranged to intersect therewith, and memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs, and wherein the input circuit for receiving the data signals includes neither said first switching MOSFET nor said second switching MOSFET. This makes it possible to simplify the input circuit, to easily manage the products and to substantially decrease the consumption of electric power.

(11) An input circuit for receiving input signals fed through the external terminals, comprising:

a first differential amplifier circuit including differential MOSFETs of a first type of electric conduction and a first MOSFET of the first type of electric conduction provided for the common sources thereof to form an operation current;

a second differential amplifier circuit including differential MOSFETs of a second type of electric conduction and a second MOSFET of the second type of electric conduction provided for the common sources thereof to form an operation current; and an inverter circuit for forming an output signal;

wherein an input signal is fed from an external terminal to the input terminals of one side of said first and second differential amplifier circuits, a reference voltage which is nearly an intermediate potential between the high level and the low level of the input signal is fed to the input terminals on the other side of said first and second differential amplifier circuits, and an output signal is synthesized from those of said first and second differential amplifier circuits which are in phase and is fed to the input terminal of said inverter circuit. There occurs no floating node that affects the output, the delay time is dispersed little, and stable input/output transfer characteristics are obtained despite the elements are finely fabricated.

(12) Said first differential amplifier circuit is provided with a first load circuit of the form of a current mirror of the second type of electric conduction, said second differential amplifier circuit is provided with a second load circuit of the form of a current mirror of the first type of electric conduction, a third MOSFET of the second type of electric conduction is provided between said first load circuit and said first operation voltage, a fourth MOSFET of the first type of electric conduction is provided between said second load circuit and said second operation voltage, any one of said first to fourth MOSFETs is turned off by the power-down signal, and said output terminal is fixed to said first or said second operation voltage by the MOSFET that is turned on by said power-down signal. This makes it possible to decrease the consumption of electric power and to stabilize the output signal in the power-down mode.

(13) The output signal of said inverter circuit is fed back to the gates of said first and second MOSFETs, and either said third MOSFET or said fourth MOSFET is turned off by said power-down signal, said third MOSFET and said fourth MOSFET corresponding to said first and second MOSFETs that are turned on by the output signal of the inverter circuit that receives a signal from the output terminal having a potential fixed by said power-down signal. This makes it possible to decrease the standby current during the LVTTL input, to decrease dispersion in the delay time, to decrease the consumption of electric power and to stabilize the output signal in the power down mode.

(14) Provision is further made of a bias voltage-generating circuit which receives said input signal, turns said first and second MOSFETs on when the level of the signal is near a central voltage between said first power source voltage and said second power source voltage, and, when the input signal is said first voltage or said second voltage during a predetermined period of time, generates a control voltage to turn either one of said first or said second MOSFET on and to turn the other one off in order to form an output signal corresponding thereto, thereby to supply an input signal of a first amplitude which is a relatively large amplitude corresponding to said first operation voltage and said second operation voltage as well as an input signal of a relatively small second amplitude corresponding to a predetermined intermediate voltage between said first operation voltage and said second operation voltage. This makes it possible to simplify the input circuit, to facilitate the management and handling of the products, to decrease the consumption of electric power, to prevent the occurrence of a floating node that affects the output, and to decrease the dispersion in the delay time.

(15) Said first and second MOSFETs constitute a parallel circuit of a MOSFET corresponding to a first operation mode and is served with the input signal of said first amplitude and a MOSFET corresponding to a second operation mode and is served with the input signal of said second amplitude, the gate of the MOSFET corresponding to said first operation mode is served with a control signal formed by said bias voltage-generating circuit, and the output signal of said inverter circuit is fed back to the gate of the MOSFET corresponding to said second operation mode. This makes it possible to execute the operations corresponding to the respective operation modes.

(16) The bias voltage-generating circuit is a CMOS circuit comprising a fifth MOSFET of the second type of electric conduction served with said input signal through the gate thereof and served with said first operation voltage through the source thereof, a sixth MOSFET of the first type of electric conduction served with said input signal through the gate thereof and served with said second operation voltage through the source thereof, and a first high-resistance means and a second high-resistance means provided between the drain of said fifth MOSFET and the drain of said sixth MOSFET. This makes it easy to set a constant.

(17) An input circuit for a dynamic RAM including a plurality of word lines, a plurality of bit lines arranged to intersect therewith, and memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs. This makes it possible to simplify the management and handling of the products, to decrease the consumption of electric power, to prevent the occurrence of a floating node that affects the output and to decrease dispersion in the delay time.

In the foregoing was concretely described the invention accomplished by the inventors by way of embodiments. However, the invention is in no way limited to the above-mentioned embodiments only but can be varied in a variety of ways without departing from the spirit and scope of the invention. In the dynamic RAM shown in FIG. 23 or 24, for example, the memory arrays, subarrays and subword drivers can be constituted in a variety of ways. Besides, the input/ output interface of the dynamic RAM may take a variety of forms so as to be adapted to the run-bus specification in addition to the synchronous specification. The word lines may employ the hierarchical word line system as described above or the word shunt system.

The semiconductor integrated circuit device may be a static RAM, a read-only memory such as EPROM or EEPROM, or a digital integrated circuit such as microprocessor, in addition to the DRAM. The present invention can be widely utilized for a variety of semiconductor integrated circuit devices that are connected together through such an interface as LVTTL, LVCMOS or SSTL.

Briefly described below is the effect obtained by a representative example of the invention disclosed in the present application. That is, differential amplifier circuits that receive input signals fed through external terminals are served with a first operation voltage and a second operation voltage through a first switching MOSFET and a second switching MOSFET, said first and second switching MOSFETs are turned on by a bias voltage-generating circuit when said input signal is near a central voltage of said first and second operation voltages, control voltages are formed to turn either said first switching MOSFET or said second switching MOSFET on and to turn the other one off to produce a corresponding output signal when the input signal continuously assumes said first voltage or said second voltage for a predetermined period of time, thereby to supply an input signal of a first amplitude corresponding to said first operation voltage and said second operation voltage as well as an input signal of a second amplitude corresponding to a predetermined intermediate voltage between said first operation voltage and said second operation voltage. This makes it possible to simplify the input circuit, to simplify the management and handling of the products and to substantially decrease the consumption of electric power.

Briefly described below is the effect obtained by another representative example of the invention disclosed in the present application.

That is, an input circuit for receiving input signals fed through the external terminals, comprising:

a first differential amplifier circuit including differential MOSFETs of a first type of electric conduction and a first MOSFET of the first type of electric conduction provided for the common sources thereof to form an operation current;

a second differential amplifier circuit including differential MOSFETs of a second type of electric conduction and a second MOSFET of the second type of electric conduction provided for the common sources thereof to form an operation current; and an inverter circuit for forming an output signal;

wherein an input signal is fed from an external terminal to the input terminals of one side of said first and second differential amplifier circuits, a reference voltage which is nearly an intermediate potential between the high level and the low level of the input signal is fed to the input terminals on the other side of said first and second differential amplifier circuits, and an output signal is synthesized from those of said first and second differential amplifier circuits which are in phase and is fed to the input terminal of said inverter circuit. This prevents the occurrence of a floating node that affects the output and decreases the dispersion in the delay time.

What is claimed is:

1. A semiconductor integrated circuit device having an input circuit that comprises:

differential amplifier circuits which receive an input signal fed through external terminals;

a first switching MOSFET which feeds a first operation voltage to said differential amplifier circuits;

a second switching MOSFET that feeds a second operation voltage to said differential amplifier circuits; and a bias voltage-generating circuit which receives said input signal and generates a control voltage which turns said first and second switching MOSFETs ON when said input signal is near a central voltage between said first operation voltage and said second operation voltage, and, when the input signal is said first voltage or said second voltage for a predetermined period of time, turns either said first switching MOSFET or said second switching MOSFET ON but turns the other one OFF to form an output signal corresponding thereto;

thereby to supply an input signal of a first amplitude corresponding to said first operation voltage and said second operation voltage as well as an input signal of a second amplitude corresponding to a predetermined intermediate voltage between said first operation voltage and said second operation voltage.

2. A semiconductor integrated circuit device according to claim 1, wherein said differential amplifier circuit comprises:

differential MOSFETs of a first type of electric conduction that receive said input signal and a reference voltage corresponding to a logic threshold voltage thereof;

a load MOSFET of a second type of electric conduction in the form of a current mirror provided on the drain side of said differential MOSFETs; and a constant-current MOSFET of the first type of electric conduction served with a constant voltage through its gate and is provided on the common source side of said differential MOSFETs.

3. A semiconductor integrated circuit device according to claim 2, wherein said second switching MOSFET is constituted by a MOSFET of the second type of electric conduction that is connected to said load MOSFET of the second type of electric conduction, and said first switching MOSFET is constituted by a MOSFET of the first type of electric conduction that is connected to said constant-current MOSFET of the first type of electric conduction.

4. A semiconductor integrated circuit device according to claim 1, wherein said bias voltage-generating circuit comprises:

a third MOSFET of a first type of electric conduction served with said input signal through its gate and served with said first operation voltage through its source;

a fourth MOSFET of a second type of electric conduction served with said input signal through its gate and served with said second operation voltage through its source; and a high-resistance means provided between the drain of said third MOSFET and the drain of said fourth MOSFET;

wherein a control voltage to be fed to the gate of said second switching MOSFET is output from the drain of said third MOSFET;

and a control voltage to be fed to the gate of said first switching MOSFET is output from the drain of said fourth MOSFET.

5. A semiconductor integrated circuit device according to claim 4, wherein said high-resistance means is constituted by two MOSFETs of the first type of electric conduction and the second type of electric conduction arranged in parallel and are fed with operation voltages through their gates so as to be turned ON.

6. A semiconductor integrated circuit device according to claim 1, wherein said bias voltage-generating circuit comprises:
   a third MOSFET of a first type of electric conduction served with said input signal through its gate and served with said first operation voltage through its source;
   a fourth MOSFET of a second type of electric conduction served with said input signal through its gate and served with said second operation voltage through its source; and
   a first high-resistance means and a second high-resistance means provided between the drain of said third MOSFET and the drain of said fourth MOSFET;
   wherein a control voltage to be fed to the gates of said first and second switching MOSFETs is output from a point where said first and second high-resistance means are connected together.

7. A semiconductor integrated circuit device according to claim 1, wherein said bias voltage-generating circuit comprises:
   a third MOSFET of a first type of electric conduction served with said input signal through its gate and served with said first operation voltage through its source;
   a MOSFET of a second type of electric conduction constituting a high-resistance element and is served with said input signal through its gate and is served with said second operation voltage through its source;
   a fourth MOSFET of the second type of electric conduction served with said input signal through its gate and served with said second operation voltage through its source; and
   a MOSFET of the first type of electric conduction constituting a high-resistance element and is served with said input signal through its gate and is served with said first operation voltage through its source;
   wherein a control voltage to be fed to the gate of said second switching MOSFET is output from the drain of said third MOSFET; and
   a control voltage to be fed to the gate of said first switching MOSFET is output from the drain of said fourth MOSFET.

8. A semiconductor integrated circuit device according to claim 5, wherein said input signals comprise clock signals and a plurality of input signals fed in response thereto, and each of a plurality of input circuits that receive the input signals except the clock signals comprises:
   a circuit that forcibly turns off the two MOSFETs arranged in parallel to constitute high-resistance elements between said third MOSFET and said fourth MOSFET, and said constant-current MOSFET in a predetermined operation mode in which no input signal has been supplied from the external unit; and
   a MOSFET for fixing the output signal of the differential amplifier circuit to the first operation voltage or to the second operation voltage.

9. A semiconductor integrated circuit device according to claim 1, wherein said semiconductor integrated circuit device constitutes a dynamic RAM that includes:
   a plurality of word lines and a plurality of bit lines arranged to intersect each other; and
   memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

10. A semiconductor integrated circuit device according to claim 8, wherein said semiconductor integrated circuit device constitutes a dynamic RAM that includes:
    a plurality of word lines and a plurality of bit lines arranged to intersect each other; and
    memory cells comprising address selection MOSFETs provided at predetermined points where said plurality of word lines intersect said plurality of bit lines and are connected to the corresponding word lines through their gates, and memory capacitors connected between the corresponding bit lines and the predetermined potential via said address selection MOSFETs; and
    wherein the input circuit for receiving said data signals includes neither said first switching MOSFET nor said second switching MOSFET.

11. A semiconductor integrated circuit device comprising:
    differential amplifier circuits having a first input terminal and a first output terminal;
    a first switching MOSFET that feeds a first power source voltage to said differential amplifier circuits;
    a second switching MOSFET that feeds a second power source voltage to said differential amplifier circuits; and
    a control circuit which controls said first switching MOSFET and said second switching MOSFET depending upon an input signal fed to said first input terminal; wherein
    either a high-level signal corresponding to said first power source voltage or a low-level signal corresponding to said second power source voltage is fed to said first input terminal, so that corresponding output signals are obtained from said first output terminal;
    either said first switching MOSFET or said second switching MOSFET is turned ON and the other one is turned OFF as said high-level signal is fed to said first input terminal;
    either said first switching MOSFET or said second switching MOSFET is turned OFF and the other one is turned ON as said low-level signal is fed to said first input terminal; and
    said control circuit includes a P-channel output MOSFET and an N-channel output MOSFET whose gates are connected and whose drains are connected, so that when either said high-level signal or said low-level signal is fed to said gates, the corresponding output MOSFET is turned ON and the other output MOSFET is turned OFF.

12. A semiconductor integrated circuit device comprising:
    differential amplifier circuits having a first input terminal and a first output terminal;
    a first switching MOSFET that feeds a first power source voltage to said differential amplifier circuits;
    a second switching MOSFET that feeds a second power source voltage to said differential amplifier circuits; and
    a control circuit which controls said first switching MOSFET and said second switching MOSFET depending upon an input signal fed to said first input terminal; wherein a signal having a first amplitude comprising a first high-level signal corresponding to said first power source voltage and a first low-level signal corresponding to said second power source voltage, is fed to said first input terminal, so that a corresponding output signal is obtained from said first output terminal;

either said first switching MOSFET or said second switching MOSFET is turned ON and the other one is turned OFF as said first high-level signal is fed to said first input terminal;

either said first switching MOSFET or said second switching MOSFET is turned OFF and the other one is turned ON as said first low-level signal is fed to said first input terminal; and a signal of a second amplitude comprising a second high-level signal smaller than said first high-level signal and a second low-level signal larger than said first low-level signal, is fed to said first input terminal, so that said first switching MOSFET and said second switching MOSFETs are both turned ON.

13. A semiconductor integrated circuit device according to claim 12, wherein said control circuit includes a P-channel output MOSFET and an N-channel output MOSFET whose gates are connected and whose drains are connected, so that when either said high-level signal or said low-level signal is fed to said gates, the corresponding output MOSFET is turned ON and the other output MOSFET is turned OFF.

14. A semiconductor integrated circuit device comprising:

a first differential amplifier circuit including a first pair of MOSFETs of a first type of electric conduction and a first MOSFET connected to the common sources of said first pair of MOSFETs;

a second differential amplifier circuit including a second pair of MOSFETs of a second type of electric conduction and a second MOSFET connected to the common sources of said second pair of MOSFETs; and an output circuit, wherein an input signal is supplied to one of said first pair of MOSFETs and to one of said second pair of MOSFETs, wherein a reference voltage of an intermediate level between a high voltage and a low voltage of said input signal is supplied to the other of said first pair of MOSFETs and to the other of said second pair of MOSFETs, wherein output signals of said first and second differential amplifier circuits are supplied to an input terminal of said output circuit, and wherein an output terminal of said output circuit is connected to gates of said first and second MOSFETs.

15. A semiconductor integrated circuit device comprising:

a first differential amplifier circuit including a first pair of MOSFETs of a first type of electric conduction and a first current supplying MOSFET connected to the common sources of said first pair of MOSFETs;

a second differential amplifier circuit including a second pair of MOSFETs of a second type of electric conduction and a second current supplying MOSFET connected to the common sources of said second pair of MOSFETs; and an output circuit, wherein an input signal is supplied to one of said first pair of MOSFETs and to one of said second pair of MOSFETs, wherein a reference voltage of an intermediate level between a high voltage and a low voltage of said input signal is supplied to the other of said first pair of MOSFETs and to the other of said second pair of MOSFETs, wherein output signals of said first and second differential amplifier circuits which are in phase are supplied to an input terminal of said output circuit, and wherein an output terminal of said output circuit is connected to gates of said first and second current source MOSFETs so that said first and second current supplying MOSFETs are controlled in a complementary fashion.

16. A semiconductor integrated circuit device including an input circuit which comprises:

a first differential amplifier circuit including differential MOSFETs of a first type of electric conduction and a first MOSFET of the first type of electric conduction provided for the common sources thereof to form an operation current;

a second differential amplifier circuit including differential MOSFETs of a second type of electric conduction and a second MOSFET of the second type of electric conduction provided for their common sources to form an operation current;

an inverter circuit for forming an output signal;

wherein an input signal from an external terminal is fed to the input terminals on one side of said first and second differential amplifier circuits, and a reference voltage of nearly an intermediate potential between the high level and the low level of said input signal is fed to the input terminals on the other side of said first and second differential amplifier circuits;

output signals of said first and second differential amplifier circuits which are in phase are synthesized and are fed to the input terminal of said inverter circuit;

said first differential amplifier circuit includes a first load circuit in the form of a current mirror of the second type of electric conduction provided for the drains of said differential MOSFETs;

said second differential amplifier circuit includes a second load circuit in the form of a current mirror of the first type of electric conduction provided for the drains of said differential MOSFETs;

the output terminals of said first and second load circuits are connected together; and a third MOSFET of the second type of electric conduction is provided between said first load circuit and a first operation voltage;

a fourth MOSFET of the first type of electric conduction is provided between said second load circuit and a second operation voltage; and any one of said first to fourth MOSFET is turned OFF by a power-down signal, and said output terminal is fixed to said first operation voltage or said second operation voltage by the MOSFET that is turned ON by said power-down signal.

17. A semiconductor integrated circuit device according to claim 16, wherein:

the output signal of said inverter circuit is fed back to the gates of said first and second MOSFETs; and either said third MOSFET or said fourth MOSFET is turned OFF by said power-down signal, said third MOSFET and said fourth MOSFET corresponding to said first and second MOSFETs that are turned ON by the output signal of the inverter circuit that receives a signal from the output terminal having a potential fixed by said power-down signal.

18. A semiconductor integrated circuit device according to claim 16, wherein provision is further made of a bias voltage-generating circuit which receives said input signal, turns said first and second MOSFETs ON when the level of the signal is near a central voltage between said first power source voltage and said second power source voltage, and, when the input signal is said first voltage or said second voltage during a predetermined period of time, generates a control voltage to turn either one of said first or said second MOSFET ON and to turn the other one OFF in order to form an output signal corresponding thereto, thereby to supply an input signal of a first amplitude which is a relatively large amplitude corresponding to said first operation voltage and said second operation voltage as well as an input signal of a relatively small second amplitude corresponding to a predetermined intermediate voltage between said first operation voltage and said second operation voltage.

19. A semiconductor integrated circuit device according to claim 18, wherein said first and second MOSFETs constitute a parallel circuit of a MOSFET corresponding to a first operation mode and is served with the input signal of said first amplitude and a MOSFET corresponding to a second operation mode and is served with the input signal of said second amplitude, the gate of the MOSFET corresponding to said first operation mode is served with a control signal formed by said bias voltage-generating circuit, and the output signal of said inverter circuit is fed back to the gate of the MOSFET corresponding to said second operation mode.

20. A semiconductor integrated circuit device according to claim 19, wherein said bias voltage generating circuit comprises:
  a fifth MOSFET of the second type of electric conduction served with said input signal through its gate and served with said first operation voltage through its source;
  a sixth MOSFET of the first type of electric conduction served with said input signal through its gate and served with said second operation voltage through its source; and
  a first high-resistance means and a second high-resistance means provided between the drain of said fifth MOSFET and the drain of said sixth MOSFET;
wherein said control voltage is obtained from a point where said first and second high-resistance means are connected together.

21. A semiconductor integrated circuit device according to claim 16, wherein said semiconductor integrated circuit device constitutes a dynamic RAM that includes:
  a plurality of word lines and a plurality of bit lines arranged to intersect therewith; and
  memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

22. A semiconductor integrated circuit device according to claim 17, wherein said semiconductor integrated circuit device constitutes a dynamic RAM that includes:
  a plurality of word lines and a plurality of bit lines arranged to intersect therewith, and
  memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

23. A semiconductor integrated circuit device according to claim 18, wherein said semiconductor integrated circuit device constitutes a dynamic RAM that includes:
  a plurality of word lines and a plurality of bit lines arranged to intersect therewith; and
  memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

24. A semiconductor integrated circuit device according to claim 19, wherein said semiconductor integrated circuit device constitutes a dynamic RAM that includes:
  a plurality of word lines and a plurality of bit lies arranged to intersect therewith; and
  memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

25. A semiconductor integrated circuit device according to claim 20, wherein said semiconductor integrated circuit device constitutes a dynamic RAM that includes:
  a plurality of word lines and a plurality of bit lines arranged to intersect therewith; and
  memory cells comprising address selection MOSFETs provided at predetermined points where said plurality of word lines intersect said plurality of bit lines and are connected to the corresponding word lines through the gates thereof, and memory capacitors connected between the corresponding bit lines and the predetermined potential via said address selection MOSFETs.

* * * * *